US012765152B2

(12) United States Patent
Park et al.

(10) Patent No.: US 12,765,152 B2
(45) Date of Patent: Oct. 13, 2026

(54) ELECTRON TRANSPORT LAYER FOR PEROVSKITE SOLAR CELL AND PEROVSKITE SOLAR CELL INCLUDING SAME

(71) Applicant: UIF (University Industry Foundation), Yonsei University, Seoul (KR)

(72) Inventors: Jong Hyeok Park, Seoul (KR); Jung Hwan Lee, Seoul (KR)

(73) Assignee: UIF (UNIVERSITY INDUSTRY FOUNDATION), YONSEI UNIVERSITY, Seoul (KR)

(*) Notice: Subject to any disclaimer, the term of this patent is extended or adjusted under 35 U.S.C. 154(b) by 361 days.

(21) Appl. No.: 18/398,313

(22) Filed: Dec. 28, 2023

(65) Prior Publication Data

US 2024/0260283 A1 Aug. 1, 2024

(30) Foreign Application Priority Data

Jan. 25, 2023 (KR) ........................ 10-2023-0009312

(51) Int. Cl.
*H10K 30/00* (2023.01)
*H10K 30/10* (2023.01)
(Continued)

(52) U.S. Cl.
CPC ............. *H10K 30/10* (2023.02); *H10K 30/50* (2023.02); *H10K 30/85* (2023.02); *H10K 71/15* (2023.02); *H10K 71/441* (2023.02)

(58) Field of Classification Search
CPC .... H10K 30/151; H10K 30/152; H10K 30/50; H10K 30/84; H10K 30/85; H10K 71/15; H10K 71/441
See application file for complete search history.

(56) References Cited

FOREIGN PATENT DOCUMENTS

| | | |
|---|---|---|
| CN | 113421969 | 9/2021 |
| KR | 1020180083823 | 7/2018 |

OTHER PUBLICATIONS

Lee, J.W., et al.,"Interfacial α-FAPbl phase stabilization by reducing oxygen vacancies in SnO2-x," Joule, published online on Jan. 13, 2023; in print on Feb. 15, 2023, vol. 7, Issue 2, pp. 380-397, DOI: https://doi.org/10.1016/j.joule.2022.12.006.

(Continued)

*Primary Examiner* — Reema Patel
(74) *Attorney, Agent, or Firm* — DUANE MORRIS LLP; Gregory M. Lefkowitz

(57) ABSTRACT

The present disclosure relates to an electron transport layer for a perovskite solar cell, which is tin oxide ($SnO_{2-x}$, 0<x<1) comprising oxygen vacancies, wherein the oxygen vacancies are passivated by oxidized black phosphorus quantum dots (O-BPs), and a perovskite solar cell including the same. The electron transport layer for a perovskite solar cell of the present disclosure can prevent phase transition to a structure having semiconductor properties not suitable for solar cells, such as δ-$FAPbI_3$ or $PbI_2$, due to the occurrence of iodine interstitials ($I_i$) in the perovskite structure caused by deficiency of oxygen atoms in $SnO_{2-x}$ at the interface, by passivating the oxygen vacancies with oxidized black phosphorus quantum dots (O-BPs) containing multiple P═O bonds.

20 Claims, 20 Drawing Sheets

(51) Int. Cl.
*H10K 30/50* (2023.01)
*H10K 30/85* (2023.01)
*H10K 71/15* (2023.01)
*H10K 71/40* (2023.01)

(56) References Cited

OTHER PUBLICATIONS

Rohnacher, V., et al., "Analytical Study of Solution-Processed Tin Oxide as Electron Transport Layer in Printed Perovskite Solar Cells," Adv. Mater. Technol. 2021, 6, 2000282.
Liu, Y-T., et al., "Stable Confinement of Black Phosphorus Quantum Dots on Black Tin Oxide Nanotubes: A Robust, Double-Active Electrocatalyst toward Efficient Nitrogen Fixation," Angew. Chem. 2019, 131, 16591-16596.
Gui, R., et al., "Black phosphorus quantum dots: synthesis, properties, functionalized modification and applications," Chem. Soc. Rev., 2018, 47, 6795-6823.

| | $\tau_1$ (2.5 ns) | $\tau_2$ (13 ns) | $\tau_3$ (81 ns) |
|---|---|---|---|
| $SnO_{2-x}$ | 59% | 30% | 11% |
| $SnO_2$ | 67% | 25% | 8% |

ELECTRON TRANSPORT LAYER FOR PEROVSKITE SOLAR CELL AND PEROVSKITE SOLAR CELL INCLUDING SAME

CROSS-REFERENCE TO RELATED APPLICATION

This application claims priority to Korean Patent Application No. 10-2023-0009312 filed on Jan. 25, 2023, and all the benefits accruing therefrom under 35 U.S.C. § 119, the contents of which in its entirety are herein incorporated by reference.

BACKGROUND

1. Field

The present disclosure relates to an electron transport layer for a perovskite solar cell and a perovskite solar cell including the same, more particularly to an electron transport layer for a perovskite solar cell, which improves the unstable structure at the interface of an electron transport layer and a perovskite photoactive layer, and a perovskite solar cell including the same.

2. Description of the Related Art

In order to solve the problems caused by depletion of fossil fuel and environmental pollution, researches are being actively carried out on renewable and clean alternative energy such as solar energy, wind power and water power. Particularly, interest in solar cells, which convert solar light directly to electrical energy, is increasing greatly. The solar cell is a cell which absorbs light energy from solar light and produces current and voltage using the photovoltaic effect whereby electrons and holes are generated. Currently, n-p diode-type silicon (Si) single crystal-based solar cells having photoenergy conversion efficiency exceeding 20% are actually used solar power generation, and solar cells using compound semiconductors with better conversion efficiency such as gallium arsenide (GaAs) have been developed. However, since these inorganic semiconductor-based solar cells require highly purified materials for high efficiency, a lot of energy is required for the purification of the materials. In addition, the manufacturing cost of solar cells is high because expensive process equipment is required for preparing the raw materials into single crystals or thin films. In order to manufacture the solar cells at low cost, it is necessary to reduce the cost of the materials or manufacturing processes. Therefore, researches are being conducted on perovskite solar cells that can be manufactured with inexpensive materials and processes as alternatives to the inorganic semiconductor-based solar cells.

Recently, a perovskite solar cell using $(NH_3CH_3)PbX_3$ (X=I, Br or Cl), which is a halogen compound with a perovskite structure, as a photoactive material has been developed and researches are being conducted for its commercialization. In the early stage of the research of the perovskite solar cell (PSC), $CH_3NH_3PbI_3$ ($CH_3NH_3^+$ is hereinafter referred to as MA) was selected as the photoactive material. However, $MAPbI_3$ has poor thermal stability due to the high volatility of the organic cation MA. The use of $CH(NH_2)^{2+}$ ($CH(NH_2)^{2+}$ is hereinafter referred to as FA) organic cation instead of the organic cation MA has been proposed to solve the thermal stability problem. In addition, since $FAPbI_3$ has a wider photoresponse range in the solar spectrum than $MAPbI_3$, it has a higher potential for high-efficiency solar cells. However, the fabrication of $FAPbI_3$ thin film is more difficult than $MAPbI_3$. Because FA (2.56 Å) has a larger ion size than MA (2.17 Å), it is difficult to incorporate FA into the $PbI_6$ octahedron.

The incorporation of FA induces the tilting of the $PbI_6$ octahedron, resulting in reversible transition of the perovskite-phase $FAPbI_3$ (α phase) to an unfavorable phase (5 phase and $PbI_2$) at room temperature. There have been several researches on the stabilization of the α phase of $FAPbI_3$, such as through mixing of heterogeneous cations or anions. For example, mixing with smaller ions such as MA, Cs and Br reduces the unit cell volume of $FAPbI_3$, thereby enhancing hydrogen bonding between FA and the $PbI_6$ octahedron. The hydrogen bonding prevents irreversible transition of $FAPbI_3$ in the surrounding atmosphere and stabilizes the α phase.

In the PSC, the perovskite layer typically forms an interface with an electron or hole transport layer (ETL or HTL). The compatibility of the materials forming the interface is important for separation of charge from the perovskite while minimizing material loss. Nevertheless, although the stabilization of $FAPbI_3$ in the bulk is being studied widely, the stabilization of $FAPbI_3$ at the interface has been neglected relatively. The stabilization of $FAPbI_3$ at the interface is more important because the interface contains almost 100 times more structural defect than the bulk. Unfavorable phases such as δ-phase $FAPbI_3$ and $PbI_2$ formed at the interface will hinder the charge extraction process from $FAPbI_3$ to the transport layer, similarly to defects.

Especially, in the n-i-p structure, the perovskite is epitaxially deposited over the ETL and tuning of the interface is nearly impossible, which stresses the importance of the surface structure of the ETL. In the case of $FAPbI_3/SnO_{2-x}$, Sn and O are key atoms for the stabilization of the $PbI_6$ octahedron and organic cation, respectively, which affect the growth of the perovskite at the interface. Oxygen vacancies on the surface of $SnO_{2-x}$ can cause distortion of the perovskite structure at the interface, inducing unfavorable phases such as the δ phase, $PbI_2$ or other unknown phases. Furthermore, oxygen vacancies are more prevalent in $SnO_{2-x}$ than in $TiO_{2-x}$ due to the stronger multivalency of Sn, which further emphasizes the control of oxygen vacancies in $SnO_{2-x}$. Therefore, a technology for controlling oxygen vacancies for a $SnO_{2-x}$ based electron transport layer is required.

REFERENCES OF THE RELATED ART

Patent Documents

Korean Patent Publication No. 10-2018-0083823.
Chinese Patent Publication No. 113421969.

SUMMARY

The present disclosure is directed to providing an electron transport layer for a perovskite solar cell wherein oxygen vacancies are passivated in order to solve the problem that iodine is not fixed in the perovskite structure due to oxygen vacancies in $SnO_{2-x}$ at the interface and, because of the iodine interstitials ($I_i$), the phase transition of the perovskite phase from α-$FAPbI_3$, which is suitable for a solar cell, to unfavorable phases such as δ-$FAPbI_3$ or $PbI_2$ is induced at the interface.

The present disclosure is also directed to providing a perovskite solar cell with improved thermal and operational stability by introducing an electron transport layer wherein oxygen vacancies are passivated in order to solve the problem that the thermal stability and operational stability of the solar cell are deteriorated due to weaker retention capacity of the FA (formamidinium) organic cation constituting the $FAPbI_3$ perovskite caused by the absence of oxygen atoms at the interface as compared to the bulk.

In an aspect, the present disclosure provides an electron transport layer for a halide perovskite solar cell, which is tin oxide ($SnO_{2-x}$, 0<x<1) including oxygen vacancies, wherein the oxygen vacancies are passivated by oxidized black phosphorus quantum dots (O-BPs).

The oxidized black phosphorus quantum dots may exhibit peaks at 129-130.5 eV and 132.5-133.5 eV in X-ray photoelectron spectroscopy (XPS) analysis.

The oxidized black phosphorus quantum dots may have a diameter of 4.5-5.5 nm.

In another aspect, the present disclosure provides a perovskite solar cell including the electron transport layer for a halide perovskite solar cell described above.

The perovskite solar cell may include: a front electrode; an electron transport layer formed on the front electrode, which includes tin oxide ($SnO_{2-x}$, 0<x<1) comprising oxygen vacancies, wherein the oxygen vacancies are passivated by oxidized black phosphorus quantum dots (O-BPs); a halide perovskite photoactive layer formed on the electron transport layer; a hole transport layer formed on the halide perovskite photoactive layer; and a back electrode formed on the hole transport layer.

The halide perovskite of the halide perovskite photoactive layer may be represented by Chemical Formula 1.

$$AMX_3 \qquad \text{[Chemical Formula 1]}$$

In Chemical Formula 1,

A is $CH(NH_2)_2^+$, $CH_3NH_3^+$ or $NR_4^+$, wherein each R is independently a hydrogen atom or a $C_1$-$C_{10}$ alkyl group, M is Pb, Sn, Bi, Ge, Ga, Ti, In, Sb or Mn, and X is I.

Specifically, the halide perovskite represented by Chemical Formula 1 may be $FAPbI_3$ (formamidinium (FA) lead triiodide).

The electron transport layer may exhibit a shoulder peak between 2.0 and 2.5 Å in K-edge XAFS (X-ray absorption fine structure) analysis.

In the electron transport layer, the oxidized black phosphorus quantum dots (0-BPs) may be located throughout the electron transport layer or at the interface of the electron transport layer and the halide perovskite photoactive layer.

The front electrode may contain any one selected from ITO (indium tin oxide), FTO (fluorine-doped tin oxide), GZO (gallium zinc oxide), IZO (indium zinc oxide), IGZO (indium gallium zinc oxide), graphene, molybdenum disulfide ($MoS_2$), single-walled carbon nanotube (SWCNT), multi-walled carbon nanotube (MWCNT) and metal mesh.

The hole transport layer may contain any one selected from spiro-OMeTAD (2,2',7,7'-tetrakis-(N,N-di-4-methoxyphenylamino)-9,9'-spirobifluorene), PEDOT:PSS (poly(3,4-ethylenedioxythiophene) polystyrene sulfonate), P3HT (poly(3-hexylthiophene-2,5-diyl)), PTAA (poly(t-arylamine)), PCBTDPP (poly[N-90-heptadecanyl-2,7carbazole-alt-3,6-bis(thiophen-5-yl)-2,5-dioctyl-2,5-dihydropyrrolo[3,4] pyrrole-1,4-dione]), PDPPDBTE (poly[2,5-bis(2-decyldodecyl)pyrrolo[3,4-c]pyrrole-1,4(2H,5H)-dione-(E)-1,2-di(2,2'-bithiophen-5-yl)ethene]), PCPDTBT (poly[2,1,3-benzothiadiazole-4,7-diyl[4,4-bis(2-ethylhexyl)-4Hcyclopenta[2,1-b:3,4-b']dithiophene-2,6-diyl]]), PCDTBT (poly[N-9'-heptadecanyl-2,7-carbazole-alt-5,5-(4",7"-di-2-thienyl-2",1",3"-benzothiadiazole)]), PFB (poly(9,9'-dioctylfluorene-co-bis-N,N'-(4-butylphenyl)-bis-N,N'-phenyl-1,4-phenylenediamine)), PANI (polyaniline), chloroaluminum phthalocyanine, tetracene, α-octithiophene, pentacene, lead(II) phthalocyanine, zinc phthalocyanine, copper(II) phthalocyanine, phthalocyanine blue, α-quaterthiophene, and α-quinguethiophene.

The back electrode may contain any one selected from gold (Au), silver (Ag), aluminum (Al), graphene, carbon, graphite, single-walled carbon nanotube (SWCNT) and multi-walled carbon nanotube (MWCNT).

In another aspect, the present disclosure provides a method for preparing a perovskite solar cell, which includes:

(a) a step of preparing oxidized black phosphorus quantum dots (O-BPs);

(b) a step of preparing a tin oxide precursor solution or a tin oxide solution and a solution containing the oxidized black phosphorus quantum dots (O-BPs);

(c) a step of coating the tin oxide precursor solution and the solution containing the oxidized black phosphorus quantum dots on a front electrode substrate and preparing an electron transport layer containing tin oxide wherein oxygen vacancies are passivated through heat treatment; and (d) a step of forming a halide perovskite photoactive layer on the electron transport layer.

The step (a) may include:

a step of preparing black phosphorus quantum dots (BPQDs) by sonicating black phosphorus powder in an organic solvent; and a step of oxidizing the black phosphorus quantum dots (BPQDs).

The sonication may be performed sequentially by first sonication at 80-120 W for 8-12 hours and second sonication at 700-900 W for 1-3 hours.

The oxidation may be performed by subjecting the organic solvent comprising the black phosphorus quantum dots (BPQDs) to relative humidity 5-15% for 20-50 minutes.

The organic solvent may be one or more selected from isopropyl alcohol (IPA), acetone, dimethylacetamide (DMA), acetonitrile, tetrahydrofuran (THF), dimethyl sulfoxide (DMSO), dimethylformamide (DMF) and hexamethylphosphoramide.

In the step (b), the tin oxide precursor contained in the tin oxide precursor solution may be $SnCl_2$.

In the step (b), the tin oxide contained in the tin oxide solution may be $SnO_{2-x}$ nanoparticles or $SnO_{2-x}$ quantum dots.

In the step (c), the tin oxide precursor solution or the tin oxide solution may be mixed with the solution containing the oxidized black phosphorus quantum dots (O-BPs) and coated on the front electrode substrate for passivating the bulk, or the tin oxide precursor solution and the solution containing the oxidized black phosphorus quantum dots (O-BPs) may be coated sequentially on the front electrode substrate for passivating the interface of the electron transport layer and the perovskite photoactive layer.

The electron transport layer for a perovskite solar cell of the present disclosure can prevent phase transition to a structure having semiconductor properties not suitable for solar cells, such as δ-$FAPbI_3$ or $PbI_2$, due to the occurrence of iodine interstitials ($I_i$) in the perovskite structure caused by deficiency of oxygen atoms in $SnO_{2-x}$ at the interface, by passivating the oxygen vacancies with oxidized black phosphorus quantum dots (O-BPs) containing multiple P═O bonds.

In addition, the perovskite solar cell of the present disclosure, which includes the electron transport layer with the oxygen vacancies passivated, may have improved photoelectric conversion efficiency and thermal and operational stability since the interfacial defect with the perovskite photoactive layer can be resolved.

DETAILED DESCRIPTION

Figure 1:
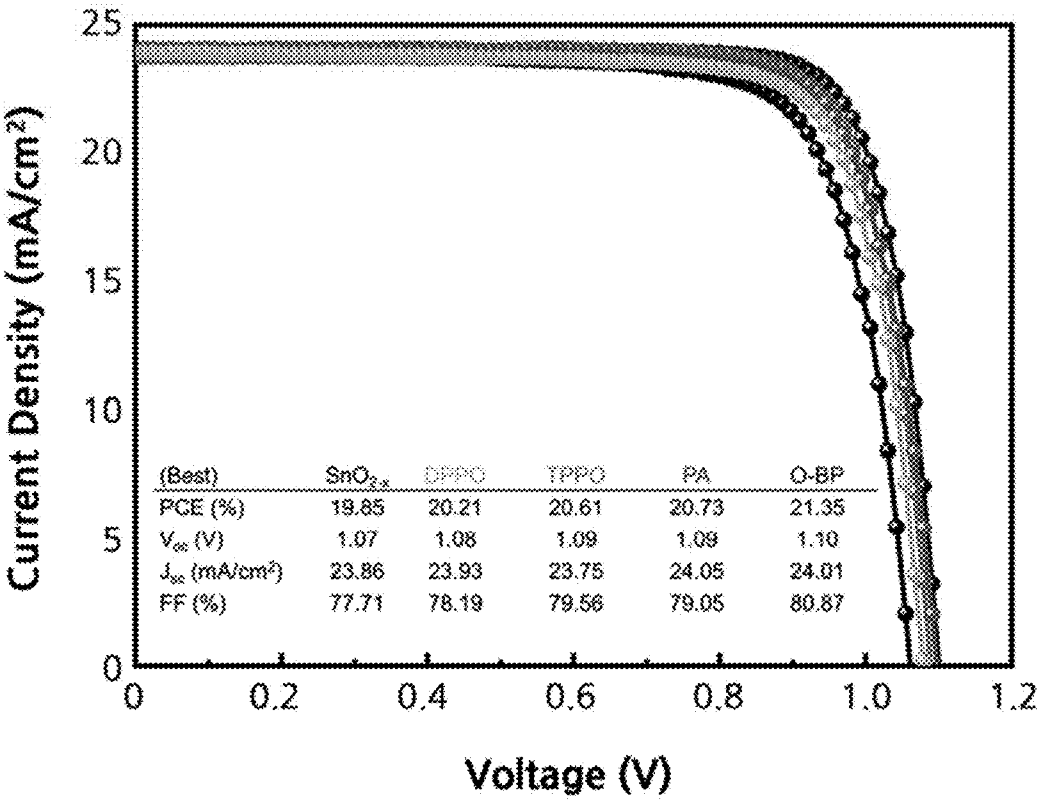
FIG. 1 shows the J-V curves of PSCs obtained in Test Example 1.

Hereinafter, various aspects and exemplary embodiments of the present disclosure are described in more detail. The exemplary embodiments of the present disclosure will be described in detail with reference to the attached drawings so that those having ordinary knowledge in the art to which the present disclosure belongs can easily carry out the present disclosure. However, the following description is not intended to limit the present disclosure to the specific exemplary embodiments and, in explaining the present disclosure, detailed description of related known technology will be omitted if it is judged that the description may obscure the gist of the present disclosure. The terms used herein are used merely to describe the specific exemplary embodiments and are not intended to limit the present disclosure. Singular expressions include plural expressions unless the context clearly dictates otherwise. In the present specification, the terms such as “include”, “have”, etc. are intended to designate the presence of features, numbers, steps, operations, components or combinations thereof described in the specification and are not intended to exclude the possibility of the presence or addition of one or more other features, numbers, steps, operations, components or combinations thereof.

Hereinafter, an electron transport layer for a perovskite solar cell of the present disclosure is described.

The electron transport layer for a perovskite solar cell of the present disclosure is tin oxide ($SnO_{2-x}$, $0<x<1$) including oxygen vacancies, wherein the oxygen vacancies are passivated by oxidized black phosphorus quantum dots (O-BPs).

Black phosphorus, from which the oxidized black phosphorus quantum dots are derived, is one of the allotropes of phosphorus. It is also called metallic phosphorus and may be obtained by heating white phosphorus at 200° C. under a pressure of 12000 kg/cm$^2$. It is iron gray with metallic luster and appears similar to graphite. The crystal has a layered lattice structure, with the distance between three neighboring phosphorus atoms being 2.18 Å, the PPP bonding angle being <102° and the interlayer P—P distance being 3.68 Å. It has a melting point of 587.5° C., a density of 2.69 g/cm$^3$ and a vapor pressure of 2.3 cm/357° C. When heated to 550° C., it changes to red phosphorus. It is a good conductor of heat and electricity and is insoluble in carbon disulfide. When yellow phosphorus is heated at high pressure below the temperature where black phosphorus is produced, amorphous black phosphorus is obtained, which may be changed to red phosphorus by heating at 125° C. for a long time.

The oxidized black phosphorus quantum dots may exhibit peaks at 129-130.5 eV and 132.5-133.5 eV in X-ray photoelectron spectroscopy (XPS) analysis.

The oxidized black phosphorus quantum dots may have a diameter of 4.5-5.5 nm.

In addition, the present disclosure provides a perovskite solar cell including the electron transport layer for a halide perovskite solar cell.

The perovskite solar cell of the present disclosure may include: a front electrode; an electron transport layer formed on the front electrode, which includes tin oxide ($SnO_{2-x}$, $0<x<1$) comprising oxygen vacancies, wherein the oxygen vacancies are passivated by oxidized black phosphorus quantum dots (O-BPs); a halide perovskite photoactive layer formed on the electron transport layer; a hole transport layer formed on the halide perovskite photoactive layer; and a back electrode formed on the hole transport layer.

The halide perovskite of the halide perovskite photoactive layer may be represented by Chemical Formula 1.

$$AMX_3 \qquad \text{[Chemical Formula 1]}$$

In Chemical Formula 1,

A is $CH(NH_2)_2^+$, $CH_3NH_3^+$ or $NR_4^+$, wherein each R is independently a hydrogen atom or a $C_1$-$C_{10}$ alkyl group, M is Pb, Sn, Bi, Ge, Ga, Ti, In, Sb or Mn, and X is I.

Specifically, the halide perovskite represented by Chemical Formula 1 may be $FAPbI_3$ (formamidinium (FA) lead triiodide). When the halide perovskite is used, the finally prepared perovskite solar cell has high thermal stability and a broader photoresponse range in the solar spectrum than $MAPbI_3$.

The electron transport layer may exhibit a shoulder peak between 2.0 and 2.5 Å in K-edge XAFS (X-ray absorption fine structure) analysis. The shoulder peak is a Sn—P peak resulting from the passivation of the oxidized black phosphorus quantum dots (0-BPs).

In the electron transport layer, the oxidized black phosphorus quantum dots (0-BPs) may be located throughout the electron transport layer or at the interface of the electron transport layer and the halide perovskite photoactive layer. Because the oxygen vacancies may result in interfacial defects, the role of the oxidized black phosphorus quantum dots (O-BPs) located at the interface may be much greater.

The front electrode may contain any one selected from ITO (indium tin oxide), FTO (fluorine-doped tin oxide), GZO (gallium zinc oxide), IZO (indium zinc oxide), IGZO (indium gallium zinc oxide), graphene, molybdenum disulfide ($MoS_2$), single-walled carbon nanotube (SWCNT), multi-walled carbon nanotube (MWCNT) and metal mesh. However, any front electrode material that can be used in a perovskite solar cell may be used without limitation.

The hole transport layer may contain any one selected from spiro-OMeTAD (2,2',7,7'-tetrakis-(N,N-di-4-methoxyphenylamino)-9,9'-spirobifluorene), PEDOT:PSS (poly(3,4-ethylenedioxythiophene) polystyrene sulfonate), P3HT (poly(3-hexylthiophene-2,5-diyl)), PTAA (poly(t-arylamine)), PCBTDPP (poly[N-90-heptadecanyl-2,7carbazole-alt-3,6-bis(thiophen-5-yl)-2,5-dioctyl-2,5-dihydropyrrolo[3,4] pyrrole-1,4-dione]), PDPPDBTE (poly[2,5-bis(2-decyldodecyl)pyrrolo[3,4-c]pyrrole-1,4(2H,5H)-dione-(E)-1,2-di(2,2'-bithiophen-5-yl)ethene]), PCPDTBT (poly[2,1,3-benzothiadiazole-4,7-diyl[4,4-bis(2-ethylhexyl)-4Hcyclopenta[2,1-b:3,4-b']dithiophene-2,6-diyl]]), PCDTBT (poly[N-9'-heptadecanyl-2,7-carbazole-alt-5,5-(4",7"-di-2-thienyl-2",1",3"-benzothiadiazole)]), PFB (poly(9,9'-dioctylfluorene-co-bis-N,N'-(4-butylphenyl)-bis-N,N'-phenyl-1,4-phenylenediamine)), PANI (polyaniline), chloroaluminum phthalocyanine, tetracene, α-octithiophene, pentacene, lead(II) phthalocyanine, zinc phthalocyanine, copper(II) phthalocyanine, phthalocyanine blue, α-quaterthiophene, and α-quinguethiophene. However, any hole transport layer material that can be used in a perovskite solar cell may be used without limitation.

The back electrode may contain any one selected from gold (Au), silver (Ag), aluminum (Al), graphene, carbon, graphite, single-walled carbon nanotube (SWCNT) and multi-walled carbon nanotube (MWCNT). However, any back electrode material that can be used in a perovskite solar cell may be used without limitation.

In addition, the present disclosure provides a method for preparing a perovskite solar cell including the electron transport layer for a halide perovskite solar cell.

First, oxidized black phosphorus quantum dots (O-BPs) are prepared (step a).

Specifically, the oxidized black phosphorus quantum dots (O-BPs) are prepared as follows.

Black phosphorus quantum dots (BPQDs) are prepared first by sonicating black phosphorus powder in an organic solvent.

Specifically, the sonication may be performed sequentially by first sonication at 80-120 W for 8-12 hours and second sonication at 700-900 W for 1-3 hours. More specifically, the first sonication may be performed at 90-110 W for 9-11 hours and the second sonication may be performed at 750-850 W for 1.5-2.5 hours. The production yield of the black phosphorus quantum dots may be improved under the above processing conditions.

Next, the black phosphorus quantum dots (BPQDs) are oxidized.

Specifically, the oxidation may be performed by subjecting the organic solvent containing the black phosphorus quantum dots (BPQDs) to relative humidity 15% or lower for 20-50 minutes in order to control the degree of oxidation. More specifically, the oxidation may be performed at relative humidity 5-15% for 25-40 minutes. If the relative humidity exceeds 15%, oxidation may occur nonuniformly because it is difficult to control the speed of oxidation.

The organic solvent may be isopropyl alcohol (IPA), acetone, dimethylacetamide (DMA), acetonitrile, tetrahydrofuran (THF), dimethyl sulfoxide (DMSO), dimethylformamide (DMF), hexamethylphosphoramide, etc. Specifically, isopropyl alcohol (IPA) may be used.

Next, a tin oxide precursor solution or a tin oxide solution and a solution containing the oxidized black phosphorus quantum dots (O-BPs) are prepared (step b).

Specifically, the tin oxide precursor contained in the tin oxide precursor solution may be $SnCl_2$.

The tin oxide contained in the tin oxide solution may be $SnO_{2-x}$ nanoparticles or $SnO_{2-x}$ quantum dots.

The organic solvent used to prepare the tin oxide precursor solution, the tin oxide solution and the solution containing the oxidized black phosphorus quantum dots may be isopropyl alcohol (IPA), acetone, dimethylacetamide (DMA), acetonitrile, tetrahydrofuran (THF), dimethyl sulfoxide (DMSO), dimethylformamide (DMF), hexamethylphosphoramide, etc. Specifically, isopropyl alcohol (IPA) may be used.

The tin oxide precursor solution and the solution containing the oxidized black phosphorus quantum dot may be used separately or in admixture depending on the location of the passivation of oxygen vacancies in the electron transport layer in the next step.

Then, an electron transport layer containing tin oxide wherein oxygen vacancies are passivated is prepared by coating the tin oxide precursor solution and the solution containing the oxidized black phosphorus quantum dots (O-BPs) on a front electrode substrate and heat-treating the same (step c).

If necessary, bulk passivation may be achieved by mixing the tin oxide precursor solution and the solution containing the oxidized black phosphorus quantum dots (O-BPs) and then coating on a front electrode substrate. Through this, oxygen vacancies may be passivated as the oxidized black phosphorus quantum dots are distributed both inside the electron transport layer and at the interface with the perovskite photoactive layer.

Alternatively, interfacial passivation may be achieved at the interface of the electron transport layer and the perovskite photoactive layer by sequentially coating the tin oxide precursor solution and the solution containing the oxidized black phosphorus quantum dots (O-BPs) on a front electrode substrate.

The improvement of interfacial defects through the passivation of oxygen vacancies in the electron transport layer is achieved by suppressing the generation of iodine interstitials ($I_i$) in the perovskite through passivation of oxygen vacancies at the interface. A sufficient effect of improving interfacial defects can be achieved simply by coating the oxidized black phosphorus quantum dots (O-BPs) at the interface.

Next, a halide perovskite photoactive layer is formed on the electron transport layer (step d).

The halide perovskite photoactive layer may contain the halide perovskite represented by Chemical Formula 1 as described above. For specific details, refer to the above description.

In addition, since the front electrode and the back electrode can be formed according to a common method for preparing a perovskite solar cell, detailed description thereof will be omitted.

Particularly, although not described explicitly in the examples described below, perovskite solar cells were prepared while varying the sonication condition and relative humidity during the oxidation in the step (a), the concentration of the tin oxide precursor solution, the concentration of the oxidized black phosphorus quantum dot (0-BP) solution and the volume ratio of the two solutions in the step (b) and the heat treatment condition in the step (c) of the method for preparing a perovskite solar cell according to the present disclosure. As a result of identifying the characteristics of the positive electrode active materials, iodine interstitials were improved at the interface of the electron transport layer and the perovskite photoactive layer, the solar efficiency of the solar cell was remarkably high with little phase transition to structures with semiconductor properties unsuitable for a solar cell, such as δ-$FAPbI_3$ or $PbI_2$, and thermal and operational stability were improved when all of the following conditions were satisfied.

In the step (a), the sonication is performed sequentially by first sonication at 90-110 W for 9-11 hours and second sonication at 750-850 W for 1.5-2.5 hours. In the step (b), the concentration of the tin oxide precursor solution is 50-100 mM for chemical bath deposition, the concentration of the oxidized black phosphorus quantum dot (0-BP) solution is 0.1-0.2 mg $mL^{-1}$ and the volume ratio of the two solutions is 100:1-100:3. In the step (c), the heat temperature is performed at 180-220° C.

Hereinafter, the present disclosure is described specifically through examples.

EXAMPLES

Preparation Example 1: Preparation of Oxidized Black Phosphorus Quantum Dots (O-BPs)

After adding 0.5 g of black phosphorus powder to 150 mL of IPA (isopropanol), oxygen was removed from the IPA by pumping argon through the solution for 10 minutes. Then, after performing sonication at 100 W for 10 hours, the obtained dispersion was transferred to an iron cup for further sonication (at 800 W for 2 hours). Argon was pumped through the dispersion consistently to prevent oxidation of the black phosphorus. Black phosphorus quantum dots (BPQDs) were prepared after the sonication. After centrifuging the BPQDs in the IPA solution, the purity of the dispersion was increased by washing several times with IPA.

Then, the solution was placed in a humidity-controlled room (RH<15%) for 30 minutes to control oxidation and oxidized black phosphorus quantum dots (O-BPs) were synthesized. The final concentration of the O-BP-dispersed IPA solution was 0.12 mg $mL^{-1}$.

Example 1: Preparation of Perovskite Solar Cell

A partially etched FTO (fluorine-doped tin oxide) (~7 $\Omega sq^{-1}$) glass substrate was washed sequentially with a detergent solution, acetone and ethanol for 20 minutes. After conducting ultraviolet (UV)-ozone (03) treatment for 20 minutes, a solution of 75 mM $SnCl_2 \cdot 2H_2O$ dissolved in IPA was spin-coated on a substrate at a speed of 3000 rpm for 30 seconds and then annealed at 200° C. for 30 minutes. In order to prepare tin oxide ($SnO_2$) with oxygen vacancies passivated, 20 μL of the O-BP dispersion prepared in Preparation Example 1 was added to 1 mL of the $SnCl_2 \cdot 2H_2O$ solution.

In order to prepare deposited $SnO_{2-x}$ in a chemical bath, 220 mg of $SnCl_2 \cdot 2H_2O$, 1 g of urea, 1 mL of HCl and 20 μL of TGA were dissolved in DI water and the FTO substrate was placed in a chemical bath for 6 hours. After the reaction, the substrate was washed with IPA and DI water in an ultrasonic bath for 5 minutes and then annealed at 170° C. for 1 hour.

In order to prepare $SnO_{2-x}$ nanoparticles ($SnO_{2-x}$ NPs), a tin(IV) oxide dispersion diluted with deionized water (Alfa Aesar) (1:5; v:v) was coated on ITO (indium-doped tin oxide) at 3000 rpm for 30 seconds and then annealed at 150° C. for 1 hour.

In order to synthesize $SnO_{2-x}$ quantum dots ($SnO_{2-x}$ QDs), 80 μL of $SnCl_4$ was added to 6 mL DI water and stirred uniformly on a hot plate at 100° C. for 30 minutes. After the synthesis, the solvent of the solution was changed to IPA (10 mL) using a centrifuge and 30 μL of oxidized black phosphorus quantum dots (O-BPs) dispersed in IPA was added to 1 mL of the solution. The $SnO_{2-x}$ QDs dispersed in IPA were coated on an ITO substrate at 3000 rpm for 30 seconds and then annealed at 200° C. for 1 hour.

For the $SnO_{2-x}$ NPs and QDs, the ITO substrate was used instead of the FTO substrate because of the high roughness of the FTO substrate. The post-processing of the O-BPs in $SnO_{2-x}$ was achieved in an O-BP dispersion (1 mL of the solution in 9 mL of IPA) diluted by spin coating (at 3000 rpm for 30 seconds).

UV-$O_3$ treatment was performed for 15 minutes before deposition of a perovskite film. A perovskite precursor solution was prepared by mixing 1.4 M FAI, 1.4 M $PbI_2$, 0.023 M MABr, 0.023 M $PbBr_2$, 0.023 M CsI and 0.5 M MACl in a mixed solvent of DMF and DMSO (85:15 (v:v)). The α phase of $FAPbI_3$ was stabilized further by adding $MAPbBr_3$ and CsI.

The precursor solution was spin-coated through a two-step process (1st: at 1000 rpm for 10 seconds, 2nd: at 5000 rpm for 20 seconds). 1 mL of diethyl ether was poured 5 seconds before the ending of the spin coating process. For passivation of perovskite, 150 μL of a solution of 10 mM MeO-PEAI (4-methoxyphenethylammonium iodide) dissolved in IPA was loaded on a substrate and spin-coated at 5000 rpm for 30 seconds. The passivated film was annealed at 100° C. for 5 minutes. Subsequently, it was annealed at 150° C. for 15 minutes and then at 100° C. for 10 minutes.

For a hole transport layer (HTL), 90 mg of spiro-OMeTAD (2,2',7,7'-tetrakis-(N,N-di-p-methoxyphenylamine)-9,9'-spirobifluorene) was dissolved in 1 mL of chlorobenzene (CB). Then, 23 μL of a Li-TFSI solution (520 mg $mL^{-1}$ in acetonitrile), 10 μL of a FK209 Co(III) TFSI solution and 39 μL of tBP (4-tert-butylpyridine) were added to the spiro-OMeTAD solution as additives. The resulting solution was spin-coated on the perovskite surface at 3000 rpm for 30 seconds.

For measurement of thermal stability, 10 mg of CuPC (copper(II) phthalocyanine) was dissolved in 1 mL of CB. Then, 7.5 μL of a Li-TFSI solution (170 mg $mL^{-1}$ in acetonitrile) and 5 μL of tBP were added to the CuPC solution as additives. Finally, 120 nm of an Au counter electrode was deposited by thermal evaporator in a high-vacuum chamber of $10^{-6}$ torr or lower at a speed of 0.8-1.2 Å $s^{-1}$.

Comparative Example 1

A perovskite solar cell was prepared in the same manner as in Example 1 except that the O-BPs prepared in Preparation Example 1 were not used.

Comparative Example 2

A perovskite solar cell was prepared in the same manner as in Example 1 except that 25 μL of PA (phosphoric acid) added to 1 mL of a $SnCl_2 \cdot 2H_2O$ solution was used as a passivating agent instead of the O-BPs prepared in Preparation Example 1.

Comparative Example 3

A perovskite solar cell was prepared in the same manner as in Example 1 except that 2 mg of DPPO (diphenylphosphine oxide) added to 1 mL of a $SnCl_2 \cdot 2H_2O$ solution was used as a passivating agent instead of the O-BPs prepared in Preparation Example 1.

Comparative Example 4

A perovskite solar cell was prepared in the same manner as in Example 1 except that 3 mg of TPPO (triphenylphosphine oxide) added to 1 mL of a $SnCl_2 \cdot 2H_2O$ solution was used as a passivating agent instead of the O-BPs prepared in Preparation Example 1.

TEST EXAMPLES

Test Example 1: Analysis of Characteristics of O-BPs

The synthesized O-BPs were used as a passivating agent to reduce oxygen vacancies in the $SnO_{2-x}$ layer. The O-BPs were selected as the passivating agent since P═O bonds were suitable candidates for Lewis acid-base passivation. The electronegativity difference between P and O atoms enables formation of a dative bond of the passivation with high binding energy. DPPO (diphenylphosphine oxide), TPPO (triphenylphosphine oxide) and PA (phosphoric acid) used in the comparative examples have been previously reported to improve the photoelectrical property of $SnO_{2-x}$. However, compared with these P═O sources, it is expected that the O-BPs of the present disclosure can further improve the photoelectrical property of $SnO_{2-x}$ by offering multiple P═O bonds and exploiting the excellent electrical properties of the O-BPs themselves.

In this test example, the power conversion efficiency (PCE) of the perovskite solar cells (PSCs) prepared in Example 1 and Comparative Examples 1-3 wherein $SnO_{2-x}$ was passivated with various P═O sources was compared. The J-V curves of the PSCs of Example 1 and Comparative Examples 1-3 are shown in FIG. 1. It can be seen that the $SnO_{2-x}$ sample of Example 1 passivated with O-BPs showed the highest improvement, with the fill factor (FF) improved significantly by 80% or higher and the shunt resistance decreased. This result suggests that the O-BPs are a better source than conventional chemicals having P═O bonds.

Figure 2:
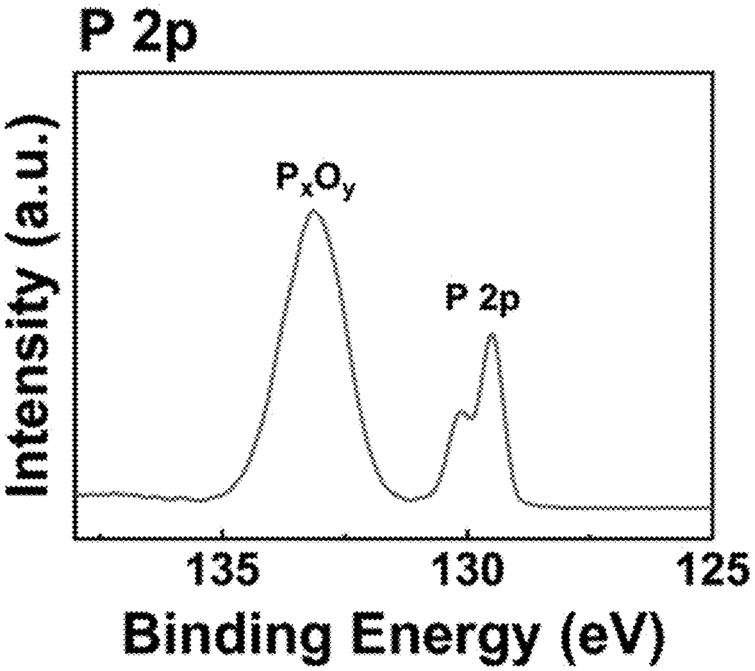
FIG. 2 shows the XPS spectrum of O-BPs obtained in Test Example 1.
Figure 3:
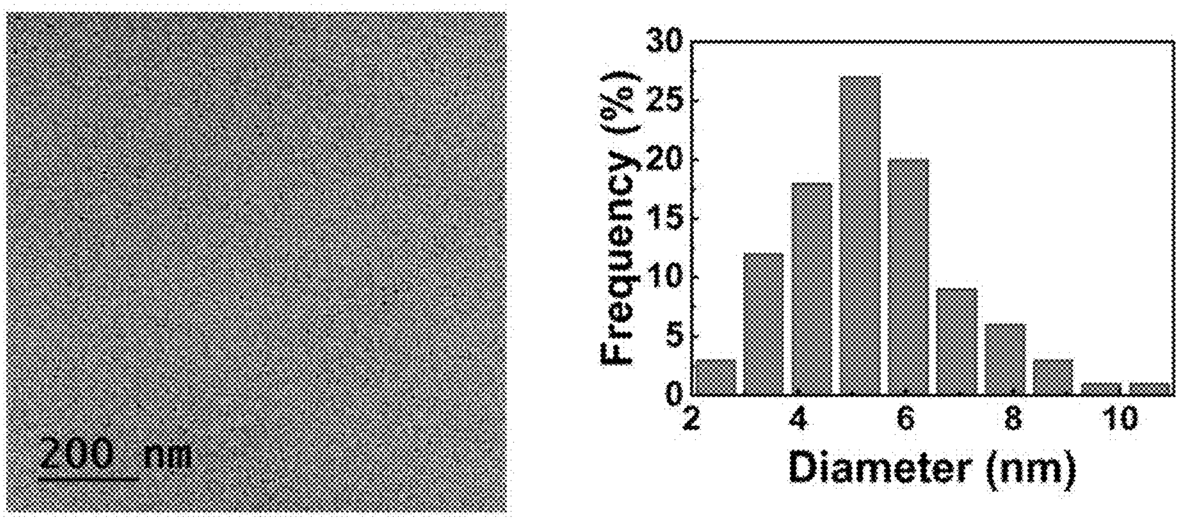
FIG. 3 shows the TEM image and size distribution of O-BPs obtained in Test Example 1.

The surface chemical state and size of the O-BPs of Example 1 were analyzed by high-resolution XPS and TEM, and the result is shown in FIG. 2 and FIG. 3. The peaks at about 130 eV are spin-orbit split peaks of the P $2p_{3/2}$ (129.49 eV) and P $2p_{1/2}$ (130.14 eV, ΔE=0.81 eV compared with P $2p_{3/2}$) pair. The broad peak at approximately 133.14 eV is assigned to the oxidative state of the O-BPs, demonstrating that the oxygen atoms are bound to the phosphorus (P) atoms of the O-BPs. In addition, the average diameter of the O-BPs was confirmed to be 5 nm from the TEM image.

That is to say, it was confirmed that the O-BPs with P═O bonds were prepared successfully with a size suitable for application to a PSC, without formation of other unwanted chemical bonds.

Test Example 2: Analysis of Passivation of Oxygen Vacancies in $SnO_{2-x}$

The characteristics of the chemical phases of $SnO_{2-x}$ and O-BP-passivated $SnO_{2-x}$ (hereinafter, denoted as $SnO_2$) were analyzed and the result is shown in FIGS. 4A to 4E. Quantitative phase analysis was conducted on $SnO_{2-x}$ and $SnO_2$ by XPS (A). In addition, the characteristics of the O-BP passivation were analyzed by XANES (X-ray absorption near edge structure) (B) and EXAFS (extended X-ray absorption fine structure) spectroscopy (C). The XANES spectrum of $SnO_{2-x}$ shifted from the XANES spectrum of $SnO_2$ to the spectrum of SnO, suggesting that $SnO_{2-x}$ consists of mixed $SnO_2$ and SnO whereas $SnO_2$ follows the spectrum of reference $SnO_2$. Meanwhile, the Sn K-edge XAFS spectrum was extracted from the XANES spectrum using Fourier transform for analysis of chemical structure characteristics (C). Distinct Sn—O (1.61 Å) and Sn—Sn (2.54 Å for $SnO_{2-x}$) peaks appeared in both spectra. Unlike $SnO_{2-x}$, the Sn K-edge XAFS spectrum of $SnO_2$ shows a shoulder peak between 2.0 and 2.5 Å. This shoulder peak can be seen as the Sn—P peak resulting from O-BP passivation. These results indicate that the O-BPs are incorporated in the bulk or at the interface.

Figure 4A:
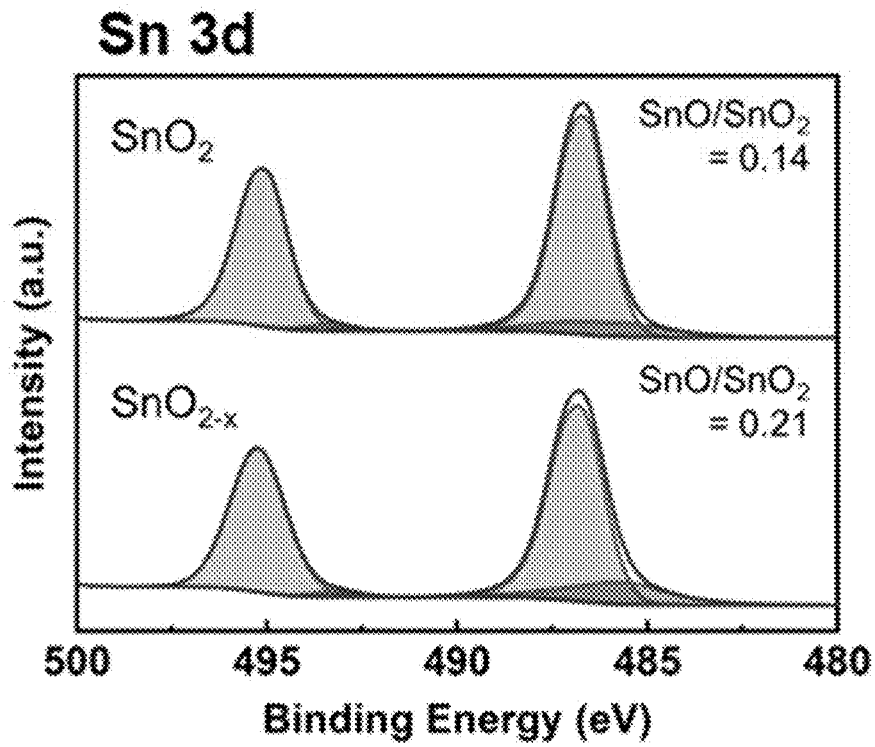
FIGS. 4A to 4E show results of analyzing the chemical phase of passivation of oxygen vacancies by O-BPs in Test Example 2.
Figure 4B:
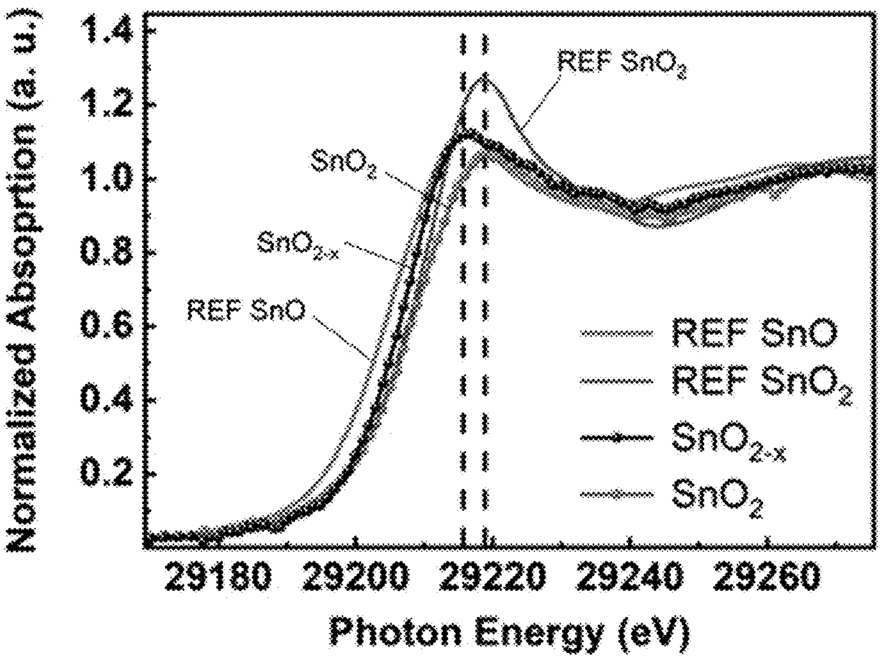
Figure 4C:
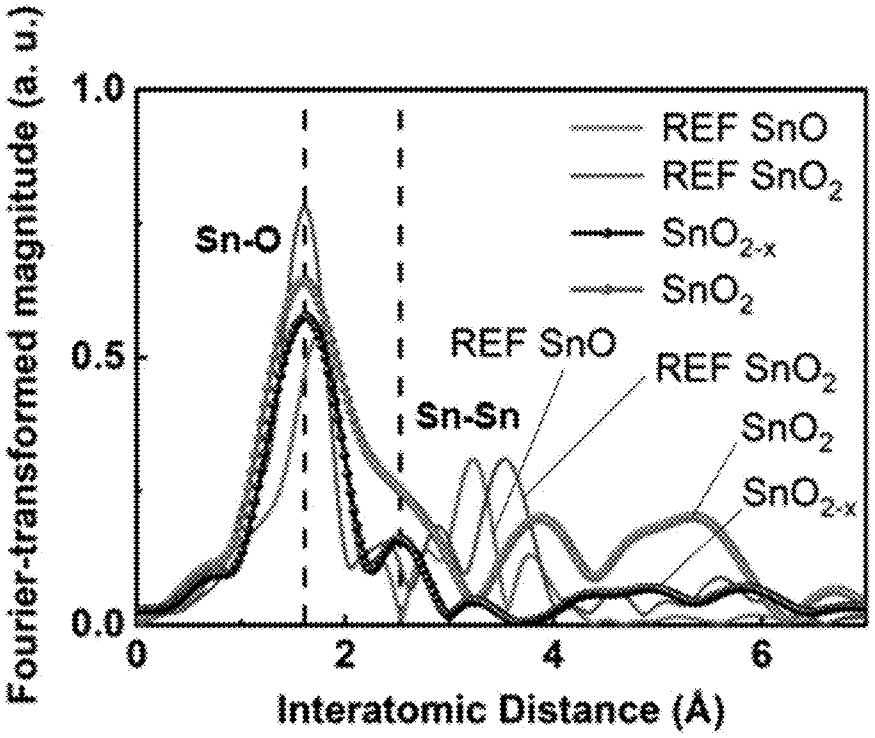
Figure 4D:
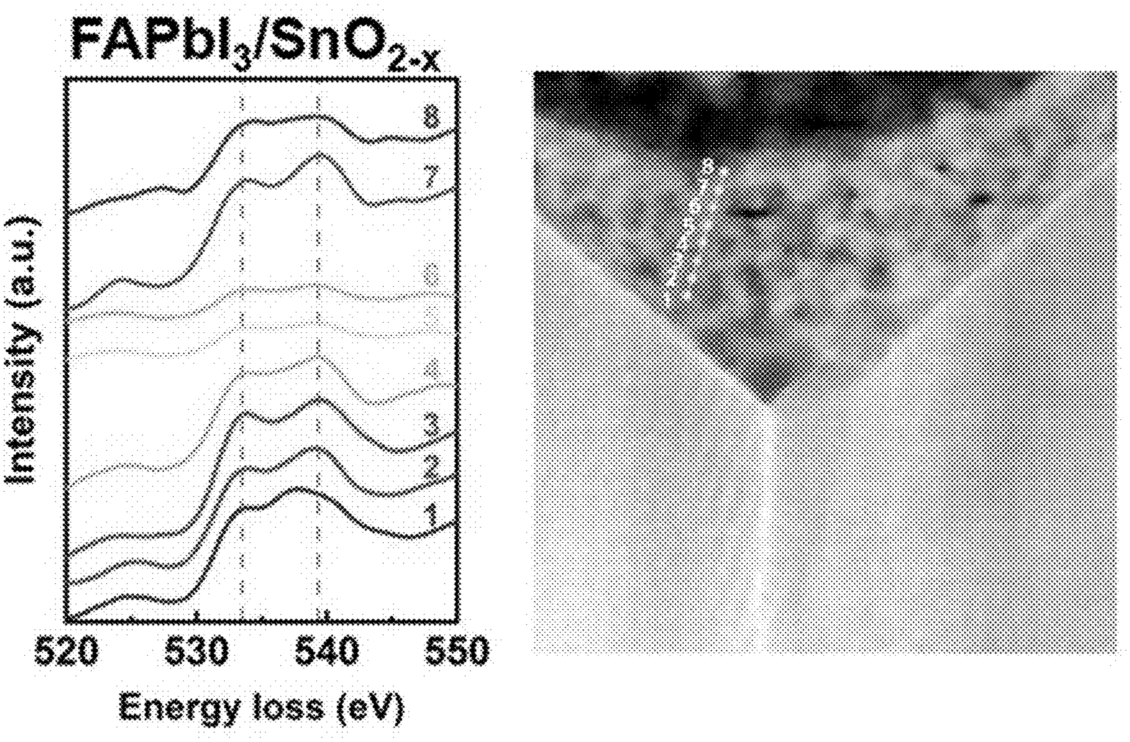
Figure 4E:
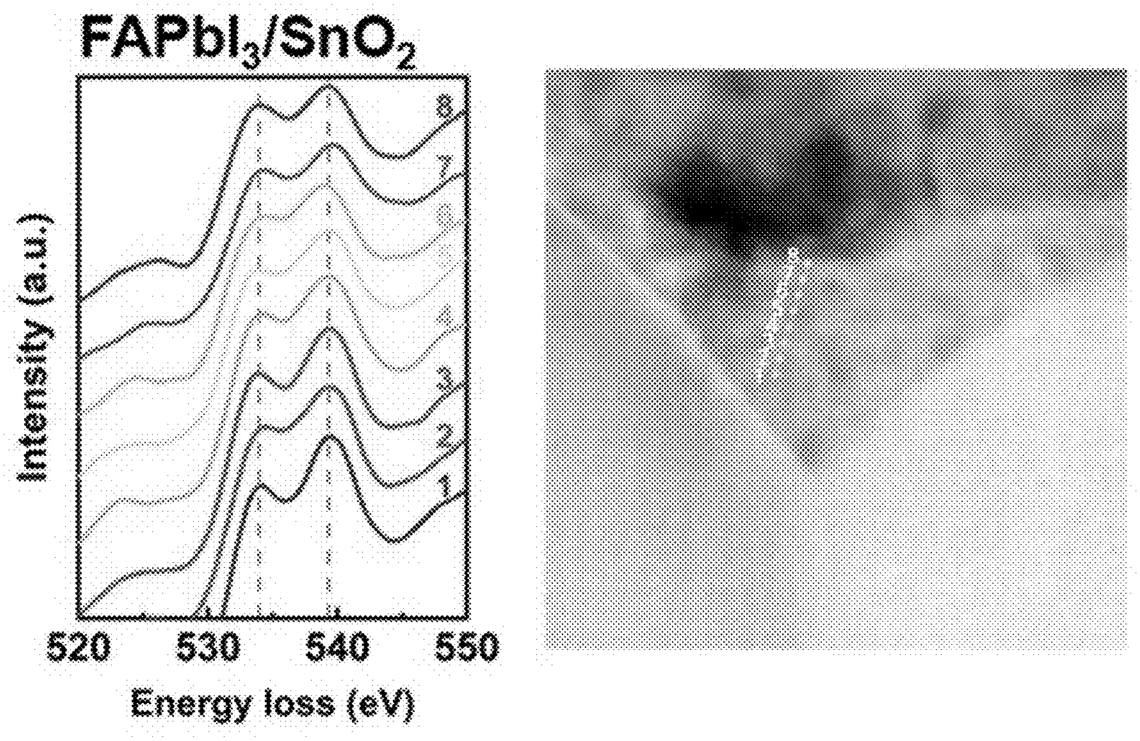

Furthermore, the accurate location of O-BP passivation was analyzed by STEM (scanning transmission electron microscopy) and EELS (electron energy loss spectroscopy). In the STEM image, eight consecutive points were selected for each sample and the corresponding EELS O-K edge profile was displayed. As shown in FIG. 4D, the EELS O-K edge profile of $SnO_{2-x}$ shows difference in the phase and oxidation state of Sn atoms from the $SnO_{2-x}$ adjacent to fluorine-doped tin oxide (FTO) to the $SnO_{2-x}$ adjacent to $FAPbI_3$. That is to say, the SnO phase mixed with the $SnO_2$ phase appears both in the bulk and at the interface, suggesting that the two sites are involved in charge loss along the $SnO_{2-x}$ layer. In contrast, from FIG. 4E, it can be seen that distinct $SnO_2$ phase peaks are observed at all the eight consecutive points without impurity peaks in the EELS O-K edge profile of $SnO_2$. Because the passivation effect occurs both in the bulk and at the interface, it can be seen that the O-BPs are located at both sites and hold greater potential as passivators than other surface passivators.

Test Example 3: Analysis of Charge Transport from $FAPbI_3$ to $SnO_{2-x}$ or $SnO_2$ The result of analyzing the charge transport characteristics of $SnO_{2-x}$ and $SnO_2$ is shown in FIGS. 5A to 5D.

Figure 5A:
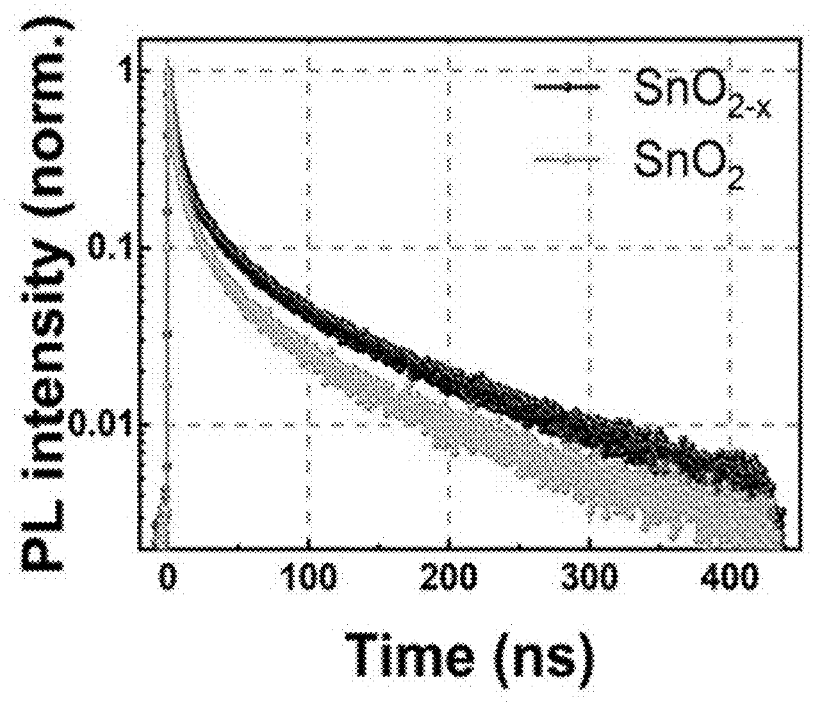
FIGS. 5A to 5D show results of analyzing the charge transport from $FAPbI_3$ to $SnO_{2-x}$ or $SnO_2$ in Test Example 3.

Specifically, the analysis result using TRPL (time-resolved photoluminescence) measurement is shown in FIG. 5A. As the oxygen vacancies were reduced, a higher portion of electrons participated in fast charge transport process ($\tau_1$) rather than in slow nonradiative (trap-mediated) recombination ($\tau_2$) and radiative (band-to-band) recombination ($\tau_3$). This result is in good agreement with the nonradiative quenching mechanism via oxygen vacancies of $SnO_{2-x}$.

Figure 5B:
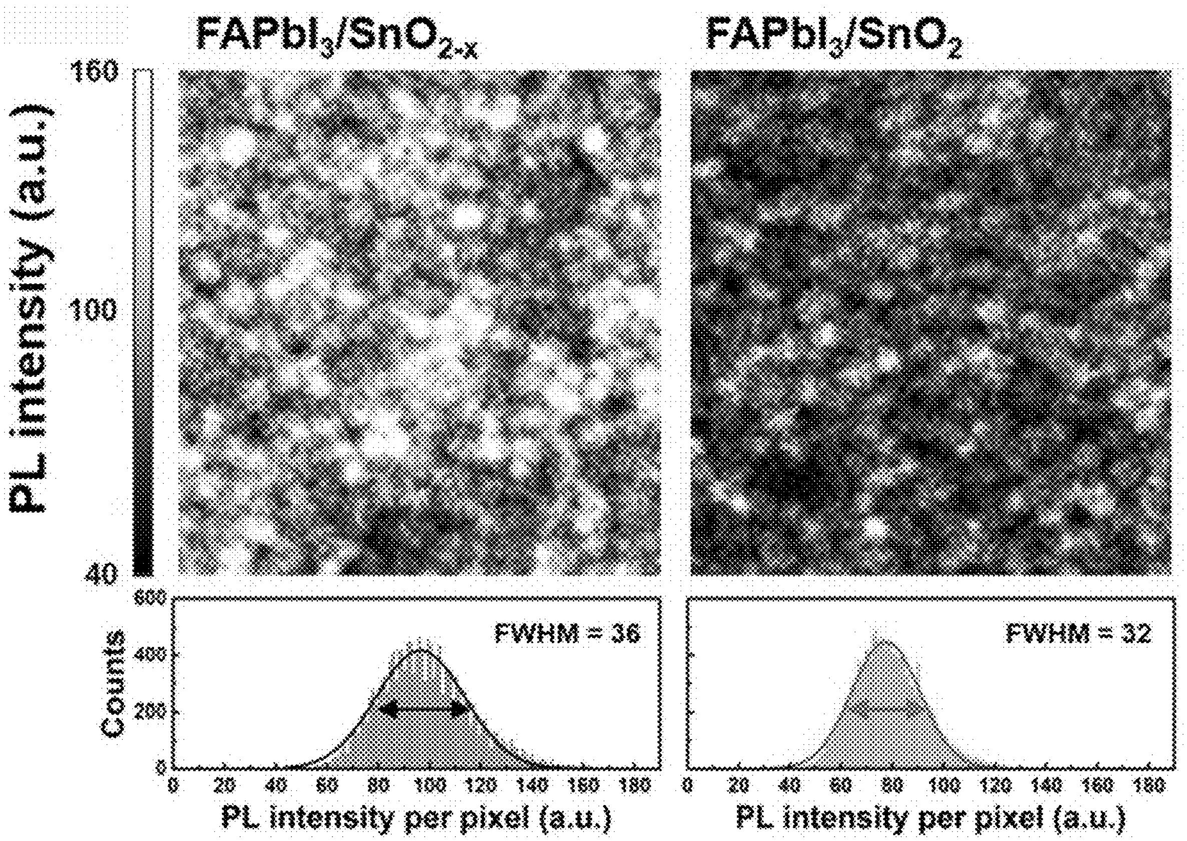

Confocal PL measurement was further carried out to analyze the uniformity of charge quenching within the film and the result is shown in FIG. 5B. Overall charge extraction from $FAPbI_3$ to the $SnO_2$ layer was improved and the uniformity was also improved. Average PL intensity was decreased by 20% after the vacancy passivation. The reduction of oxygen vacancies resulted in the decreased number of nonradiative recombination channels, thereby improving PL quenching and film uniformity.

Figure 5C:
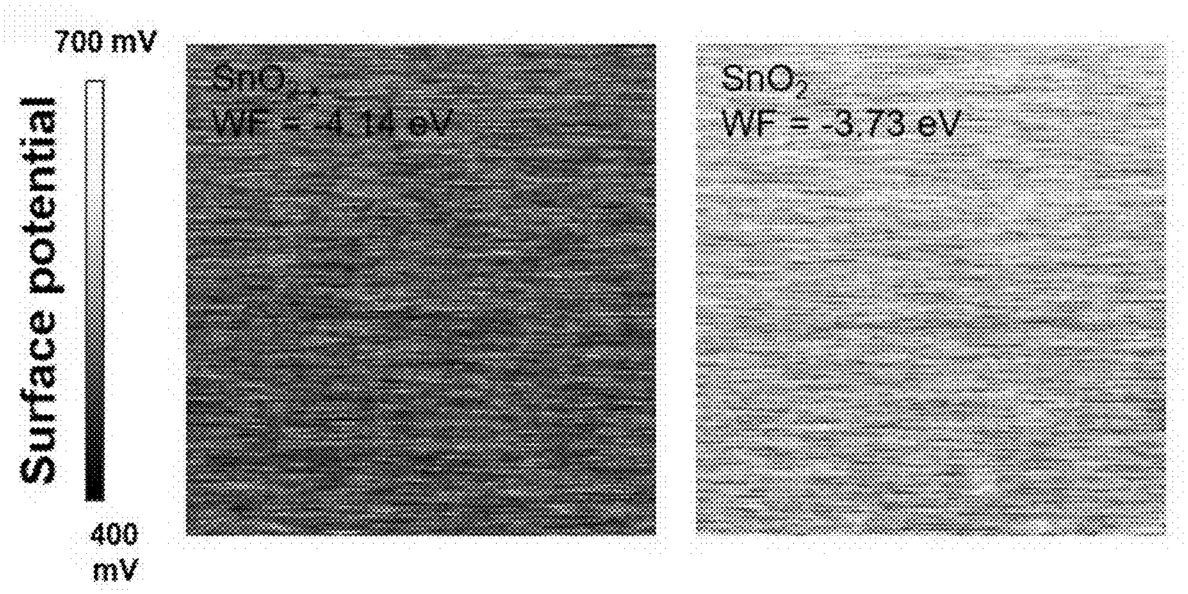
Figure 5D:
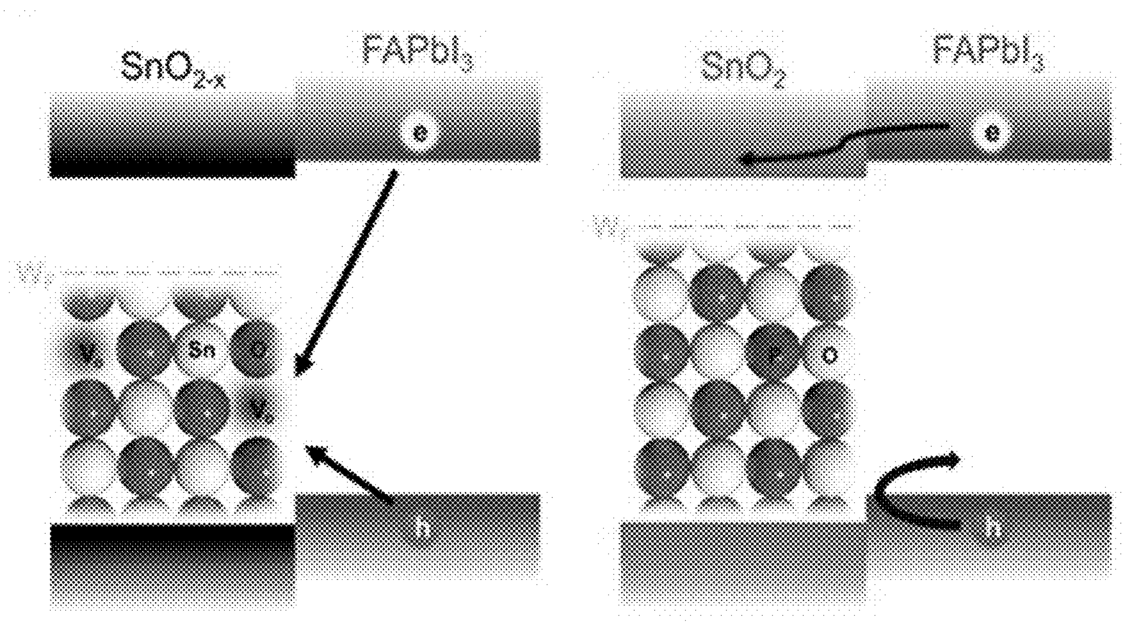

The result of KPFM (Kelvin probe force microscopy) analysis is shown in FIG. 5C. After the vacancy passivation, the surface potential of $SnO_{2-x}$ was increased greatly. In addition, the energy band alignments of $SnO_{2-x}$ and $SnO_2$ are schematically shown in FIG. 5D. It was confirmed that the increased surface potential can induce a smaller conduction band minimum (CBM) offset between $FAPbI_3$ and $SnO_2$ by upshifting the Fermi level toward the CBM of $SnO_2$.

Test Example 4: Analysis of Phase Impurities at $FAPbI_3/SnO_{2-x}$ Interface

The incorporation of O-BPs into the $SnO_{2-x}$ layer adjusted the electronic properties of the passivated $SnO_{2-x}$ layer to be suitable for the interface with perovskite. Because the perovskite layer is deposited on the $SnO_2$ layer, it is necessary to check whether the surface condition of $SnO_2$ can affect the quality of the perovskite layer after deposition. Therefore, the XRD spectrum and morphology of the perovskite adjacent to $SnO_{2-x}$ and $SnO_2$ were analyzed. The result is shown in FIGS. 6A to 6E. In this test example, $FAPbI_3$ perovskite ($Cs_{0.05}(FAPbI_3)_{0.95}(MAPbBr_3)_{0.05}$) using $MAPbBr_3$ and Cs as phase stabilizers was used.

Figure 6A:
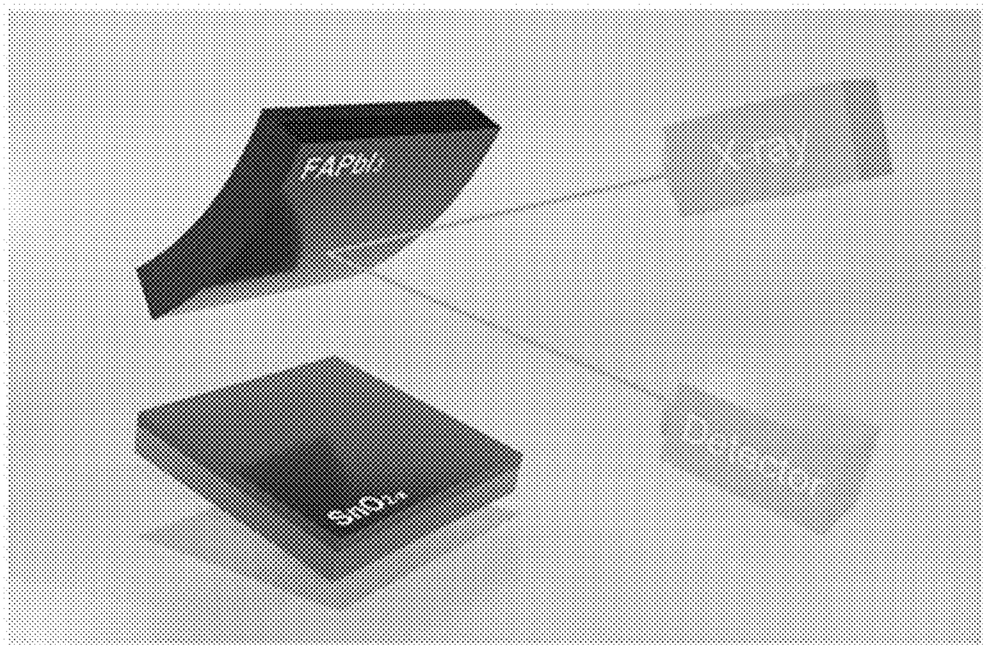
FIGS. 6A to 6E show the XRD and morphological analysis results of $FAPbI_3$ adjacent to $SnO_{2-x}$ or $SnO_2$ in Test Example 4.
Figure 6B:
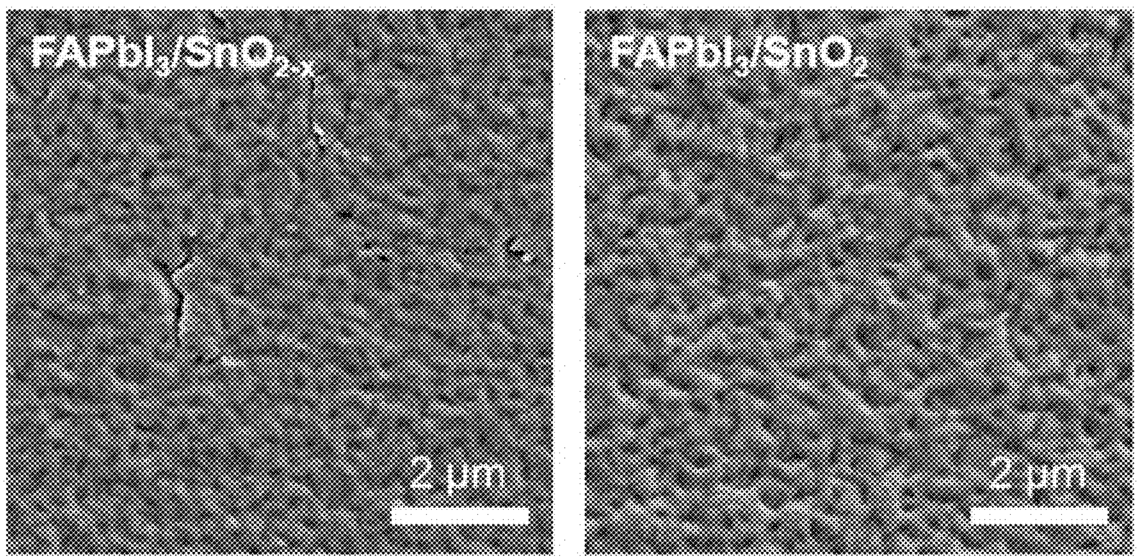
Figure 6C:
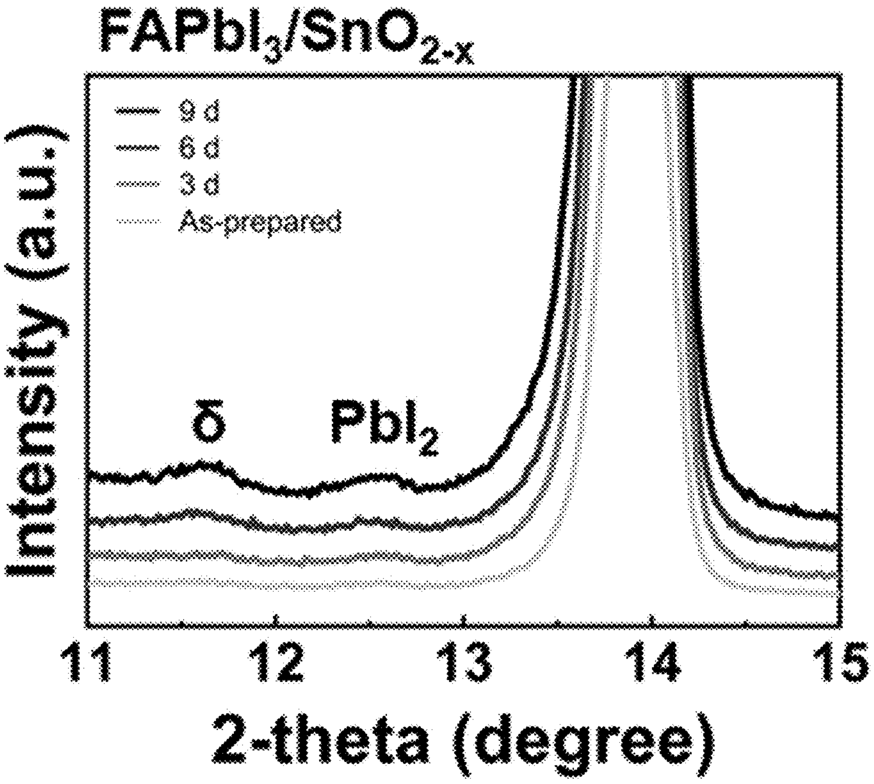
Figure 6D:
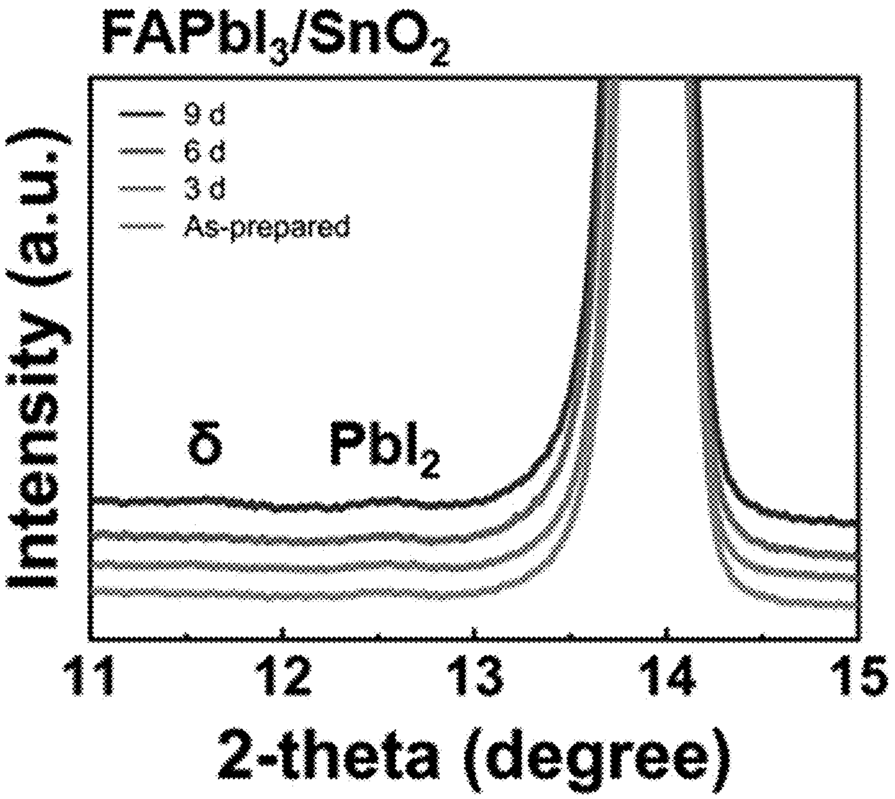

In order to investigate the crystal phase of the perovskite film adjacent to $SnO_{2-x}$ or $SnO_2$, the perovskite film was peeled off using adhesive epoxy and analyzed by XRD. The result is shown in FIG. 6A. Prior to the XRD analysis, the morphology of the interface was observed by SEM to investigate damage during the peeling process. As shown in FIG. 6B, the perovskite film peeled off from the $SnO_2$ layer showed no damage except the marks caused by the rough FTO. In contrast, the perovskite film peeled off from the $SnO_{2-x}$ layer showed additional damages such as irregular cracks and small particles, indicating the possibility of a heterogeneous phase. Unidirectional, regular cracks did not occur in either sample, indicating that no unintentional damage occurred during the peeling.

After the morphological examination, XRD analysis was performed to track unfavorable phase transition in the perovskite layer depending on aging time. A $SnO_2$ sample with an insufficient amount of O-BPs for passivation (expressed as $SnO_2$ (10 μL)) was used for comparison of the undesired phase transition related with the amount of oxygen vacancies in $SnO_2$. From the J-V curves of the PSCs in which different amounts of O-BP solutions were added to the $SnO_{2-x}$ precursor, it was inferred that 20 μL would be optimum and 10 μL and 30 μL would be insufficient or excessive for passivation, respectively.

Figure 6E:
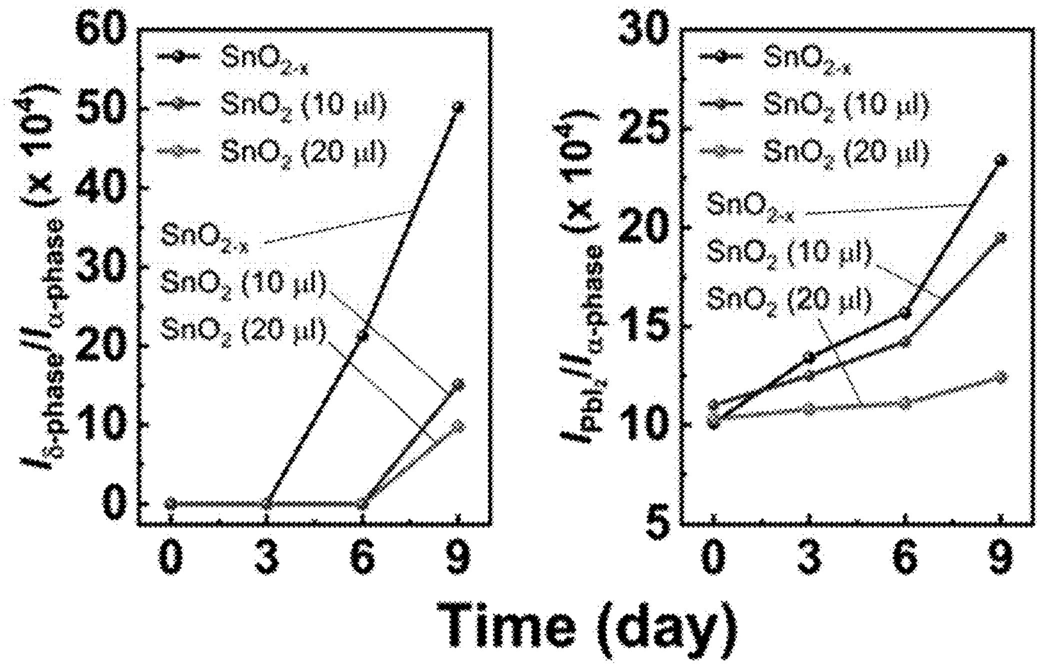

For quantitative comparison, the relative intensity of the undesirable phase peak and the (001) peak was compared, and the result is shown in FIG. 6E. The perovskite film for XRD measurement was aged (at 25° C. and RH 35%) and then peeled off from the substrate. The $FAPbI_3$ exfoliated from $SnO_{2-x}$ showed obvious increase in the intensity of δ-phase ($I_{\delta\text{-}phase}$, 2θ=11.54°) and $PbI_2$ ($I_{PbI2}$, 2θ=12.60°) peaks. On day 9, the $I_{\delta\text{-}phase}/I_{\alpha\text{-}phase}$ (×$10^4$) ratio was 50, which was about 5 times higher than those of the passivated $SnO_2$ samples ($SnO_2$ (10 μL) and $SnO_2$ (20 μL)).

In particular, $SnO_2$ (20 μL) showed a very low $I_{\delta\text{-}phase}/I_{\alpha\text{-}phase}$ (×$10^4$) ratio of about 10. In the case of $PbI_2$, $SnO_{2-x}$ and $SnO_2$ (10 μL) showed gradual growth of the $PbI_2$ phase and the $I_{\delta\text{-}phase}/I_{\alpha\text{-}phase}$ (×$10^4$) ratio reached 23 and 18, respectively, on day 9. In contrast, $SnO_2$ (20 μL) almost maintained the initial ratio for 9 days with minimal increase from 10 to 12. This shows that the degree of unfavorable phase transition of the perovskite layer is proportional to the amount of oxygen vacancies in $SnO_2$, indicating that the oxygen vacancies are the driving force of the unfavorable phase transition. Especially, the fastest increase of the $I_{PbI2}/I_{\alpha\text{-}phase}$ (×$10^4$) ratio in $SnO_{2-x}$ shows that $PbI_2$ is separated from $FAPbI_3$ or formed from the incomplete transition to the perovskite phase.

Considering the hydrogen bonding between —$NH_2$ of FA ($CH(NH_2)^{2+}$) and the I atom of the $PbI_6$-bound FA cation in the perovskite lattice, the boundary may be unclear because the FA cation lacks the source of hydrogen bonding in the perovskite lattice at the $FAPbI_3/SnO_{2-x}$ interface. Although the oxygen atom of $SnO_{2-x}$ may participate in hydrogen bonding, the possibility of oxygen vacancies disappears in that case. Therefore, it is more likely that transition occurs from the α phase to an unfavorable phase in $FAPbI_3/SnO_{2-x}$, which is supported by the higher ratio of the δ phase and $PbI_2$ in $FAPbI_3/SnO_{2-x}$. That is to say, it can be seen that the unfavorable phase is suppressed greatly when the oxygen vacancies are reduced in the adjacent $SnO_{2-x}$.

Figure 7A:
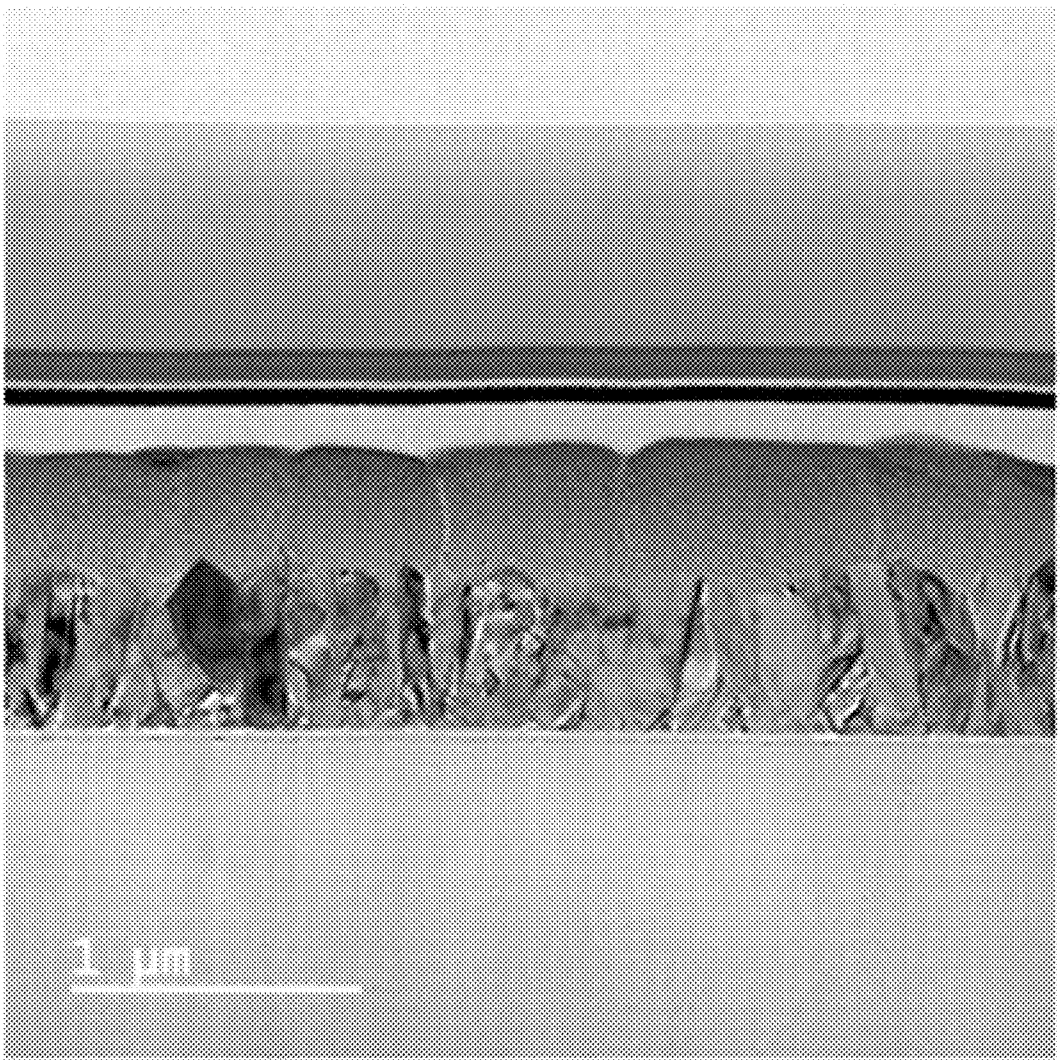
FIGS. 7A to 7F show the STEM image analysis results of $FAPbI_3/SnO_{2-x}$ or $SnO_2$ interface in Test Example 4.
Figure 7B:
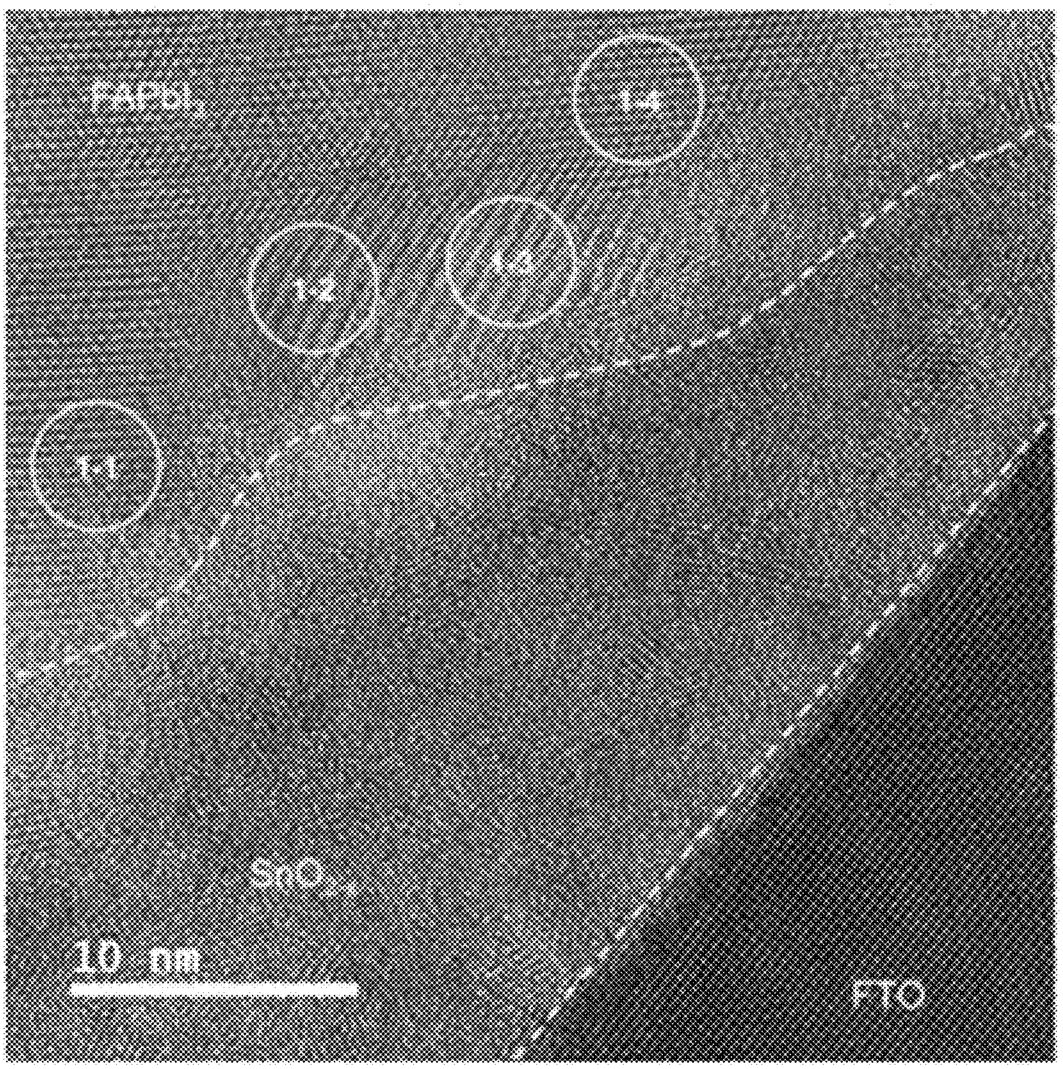
Figure 7C:
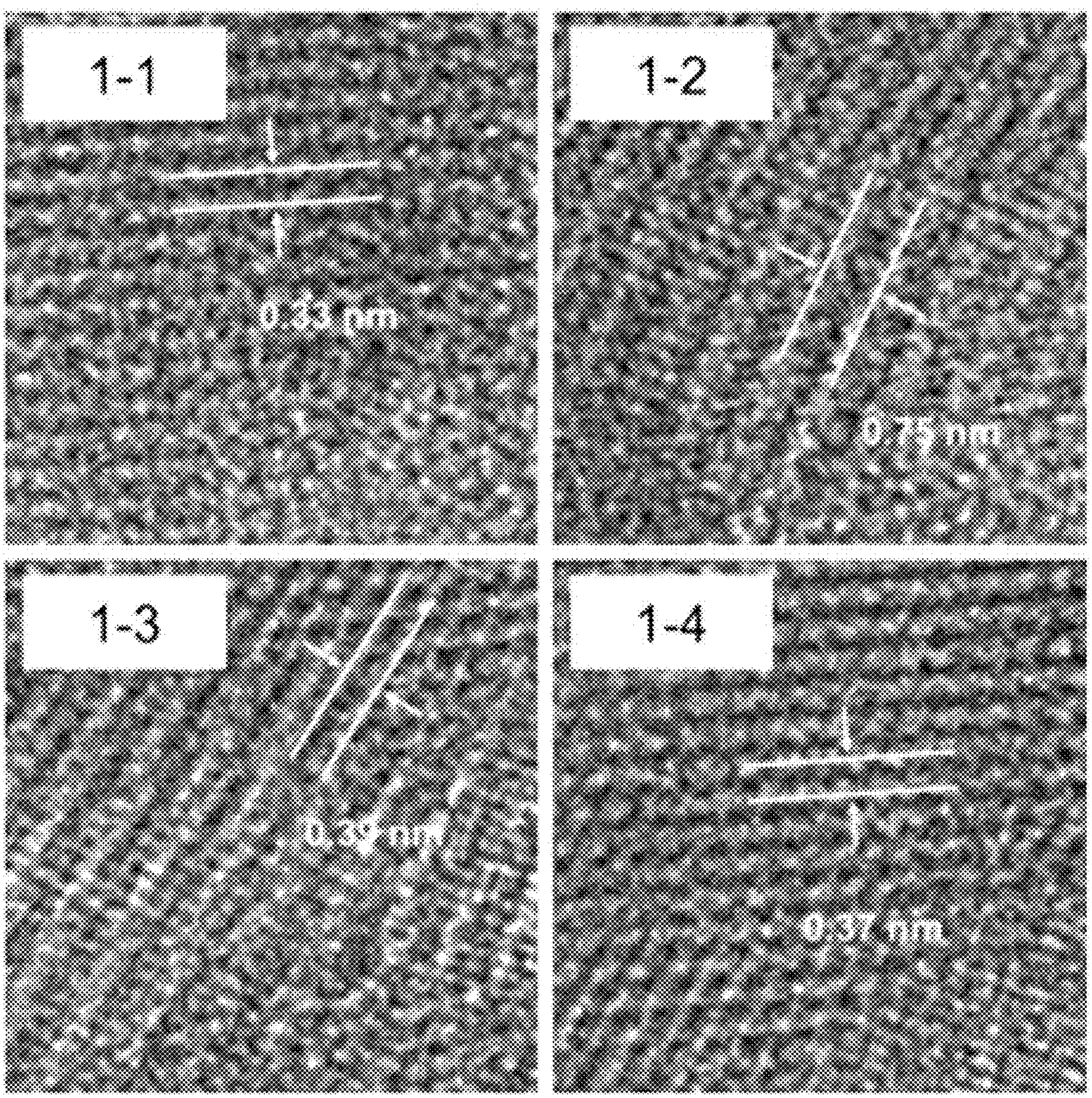
Figure 7D:
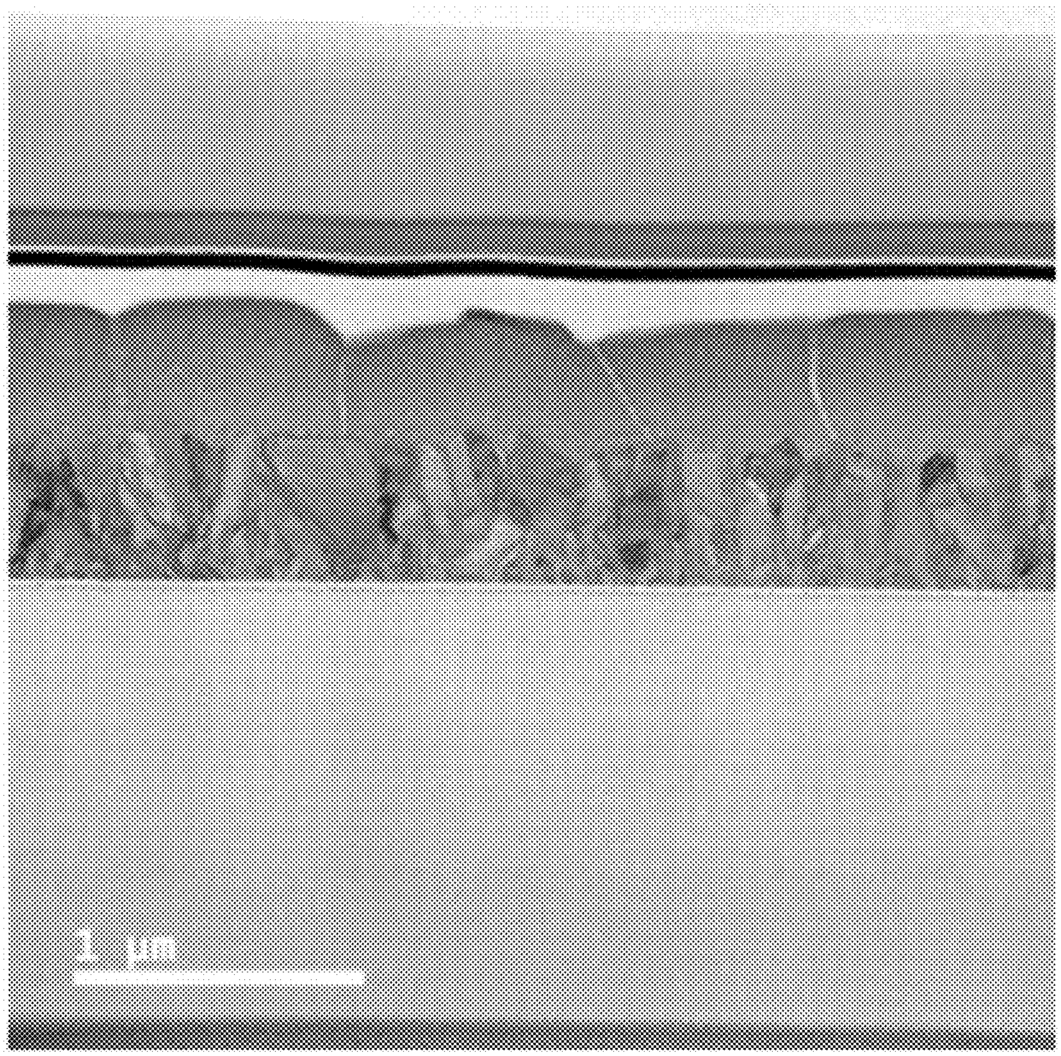
Figure 7E:
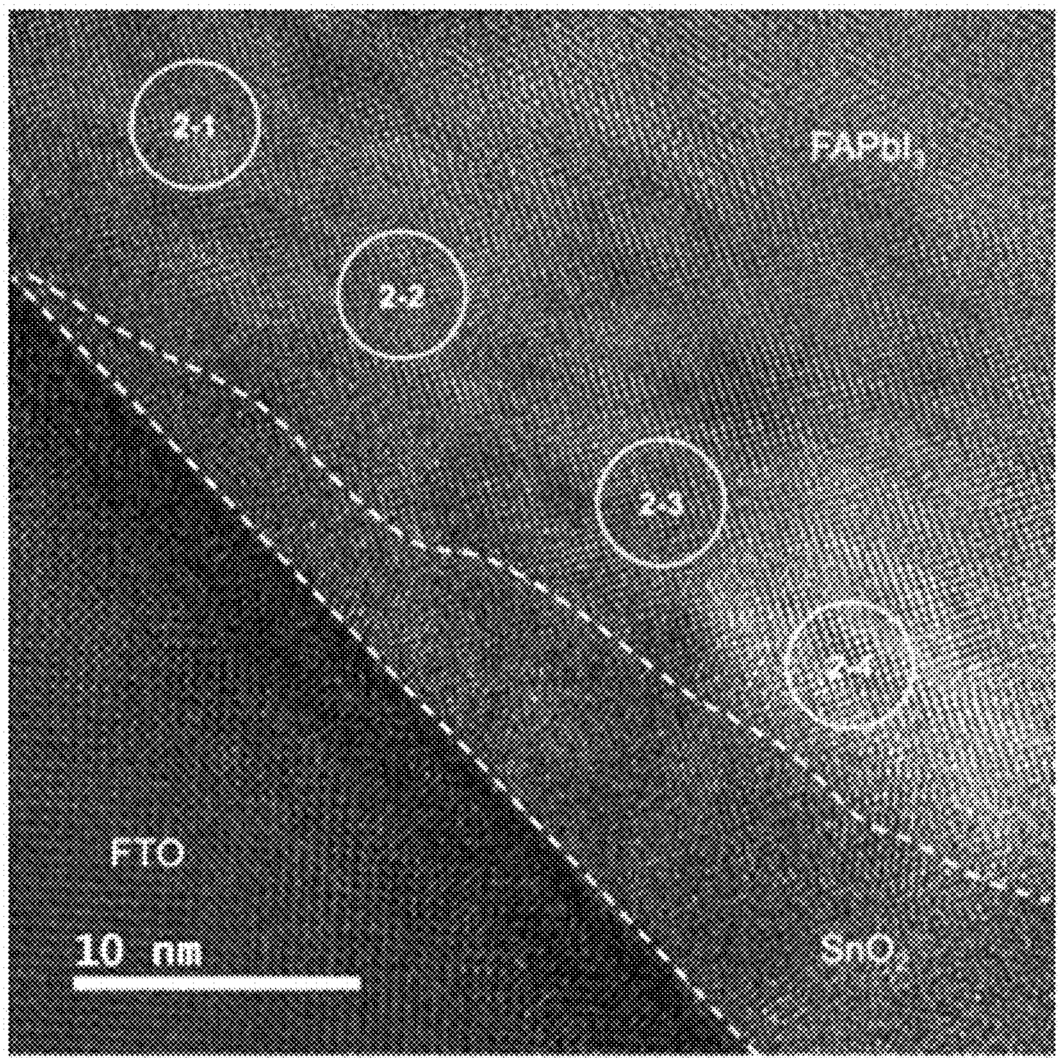
Figure 7F:
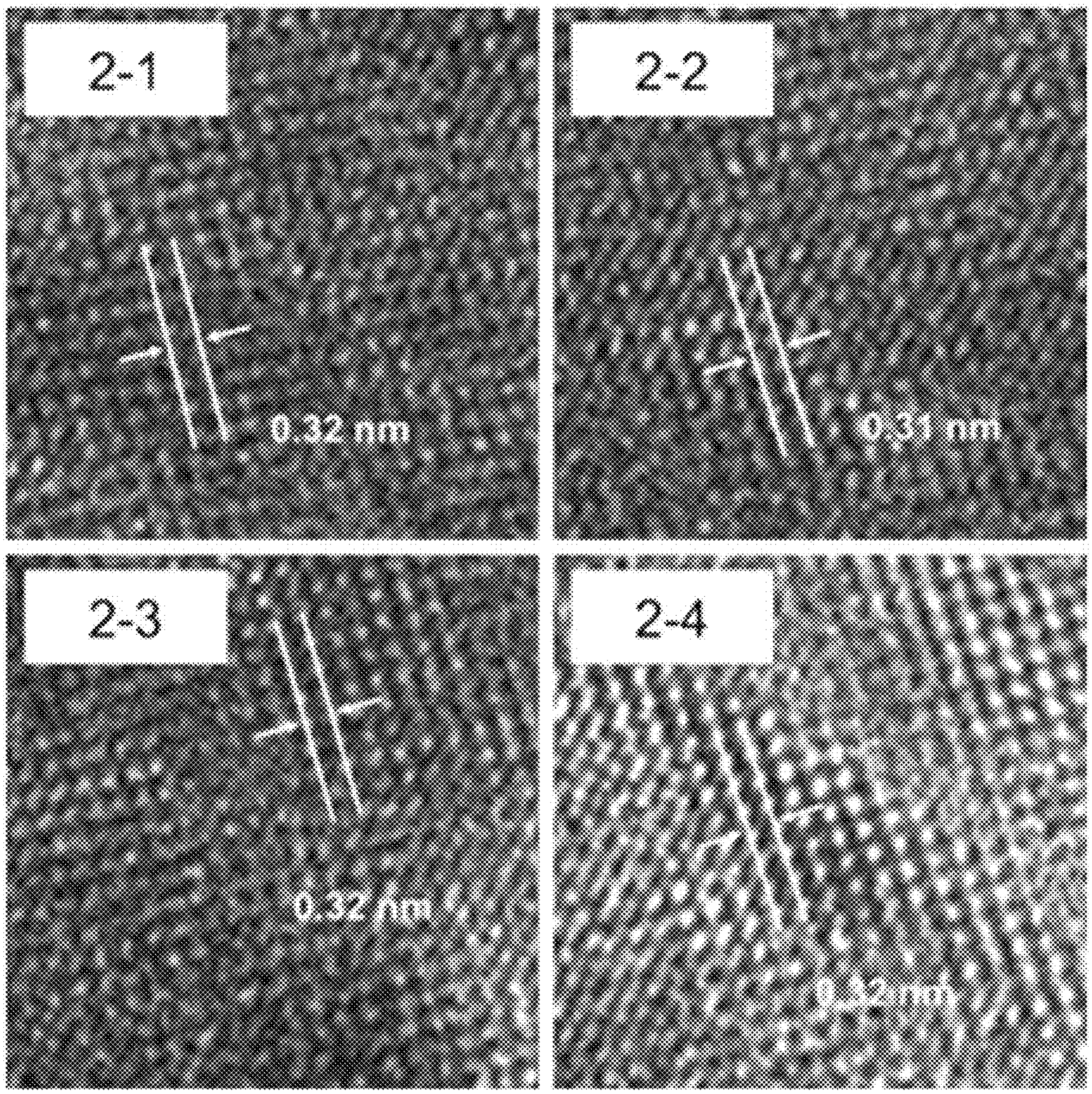

The STEM image analysis result for the interface of $FAPbI_3/SnO_{2-x}$ or $SnO_2$ is shown in FIGS. 7A to 7F. Specifically, the crystal lattice was analyzed further from the HAADF-STEM (high-angle annular dark-field STEM) image of $FAPbI_3/SnO_{2-x}$ or $SnO_2$. The cross-sectional STEM image of the entire solar cell (Au/2,2',7,7'-tetrakis-(N,N-di-p-methoxyphenylamine)-9,9'-spirobifluorene (spiro-OMeTAD)/$Cs_{0.05}(FAPbI_3)_{0.95}(MAPbBr_3)_{0.05}/SnO_{2-x}$/FTO) is shown in FIG. 7A. The uniform and dense single-layer perovskite is adjacent to $FAPbI_3/SnO_{2-x}$. The result of analyzing d-spacings and Miller indices using HAADF from the magnified STEM image of the $FAPbI_3/SnO_{2-x}$ interface is shown in FIG. 7B. In addition, the d-spacings of the crystal were measured for 4 selected interfacial sites of $FAPbI_3/SnO_{2-x}$, and the result is shown in FIG. 7C as well as crystal directions. The separate lattices exhibited different spacings and directions. The interplanar spacings of 0.33 nm and 0.37 nm matched well with the (002) and (111) crystal directions of α-phase $FAPbI_3$, respectively. The $PbI_2$ and δ-phase $FAPbI_3$ located near the $FAPbI_3/SnO_{2-x}$ interface were in good agreement with the XRD result. The presence of $PbI_2$ and δ-phase $FAPbI_3$ even without the exfoliation process provides the reliability for the XRD result and also shows that $SnO_{2-x}$ forms an interface with $PbI_2$ and mixed a/δ-phase $FAPbI_3$. In addition, FIG. 7D shows the cross-sectional STEM image of the entire solar cell in which $SnO_{2-x}$ has been replaced with $SnO_2$. It can be seen that the morphology of the nanostructure is the same as that of its counterpart on a large scale. FIG. 7E shows the four interfacial sites of $FAPbI_3/SnO_2$ selected similarly to $FAPbI_3/SnO_{2-x}$. In FIG. 7F, the interplanar spacing of the distinct lattices is nearly 0.33 nm. This d-spacing is consistent with α-phase $FAPbI_3$. Unlike $FAPbI_3/SnO_{2-x}$, most of the $FAPbI_3$ crystal adjacent to $SnO_2$ grew into pure α-phase $FAPbI_3$ as can be seen from the XRD result.

Test Example 5: Analysis of Iodine Interstitials (I) Induced by Unfavorable Phase Transition Density functional theory (DFT) calculation was performed to reveal the driving force of the unfavorable phase transition. Oxygen vacancies were introduced into the system to obtain appropriate conditions for DFT calculation. In $SnO_{2-x}$, two types of oxygen exist at the $FAPbI_3/SnO_{2-x}$ interface. One binds to the Pb atom and Sn atom of perovskite ($V_{O1}$) and the other binds only to the Sn atom ($V_{O2}$). When the oxygen vacancy formation energy was calculated for introduction of energetically more favorable oxygen vacancies into the system, it was found out that $V_{O2}$ is energetically favorable by 0.41 eV than $V_{O1}$.

Figure 8A:
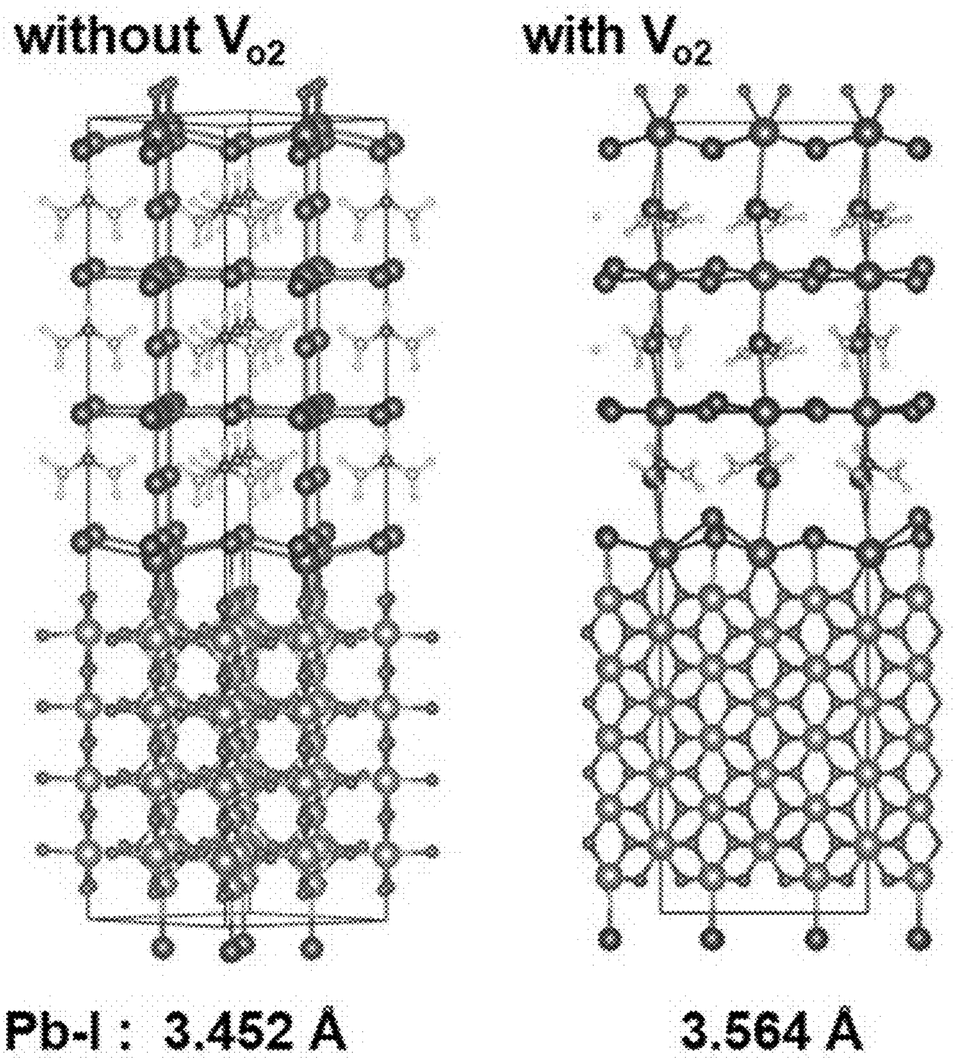
FIGS. 8A to 8C show results of analyzing unfavorable phase transition induced between iodine interstitials of tin oxide and organic cation retention capacity in Test Example 5.
Figure 8B:
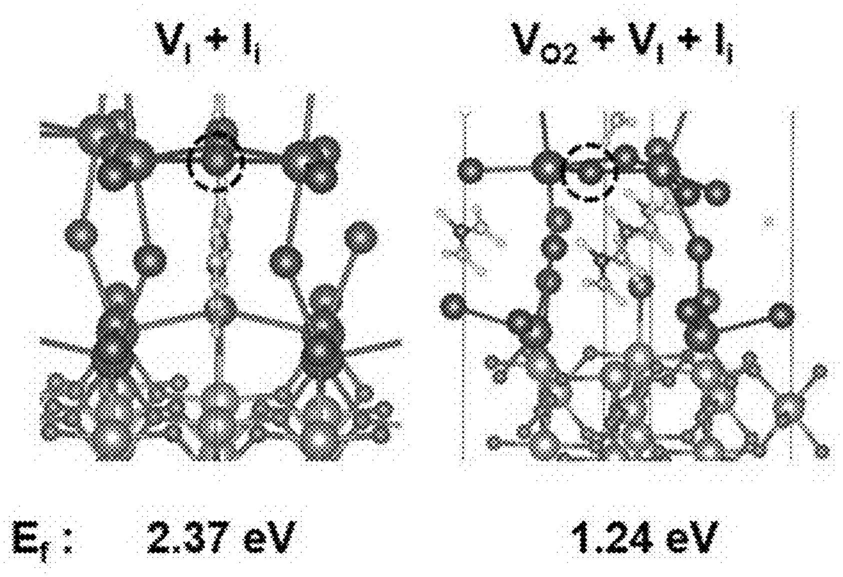
Figure 8C:
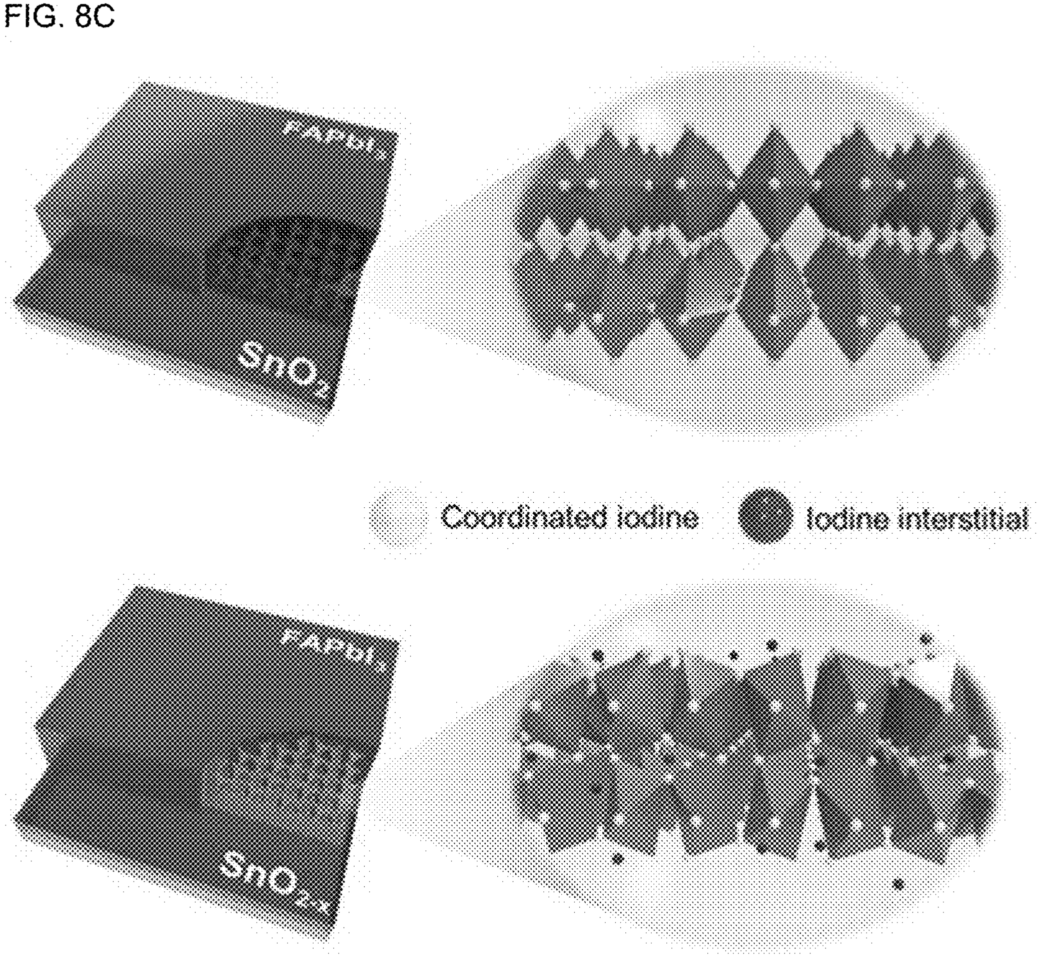

FIGS. 8A to 8C show results of analyzing the unfavorable phase transition induced between iodine interstitials of tin oxide and the organic cation retention capacity. $V_{O1}$ is relatively unsuitable because additional energy is required to break additional Pb—O bonds to form $V_{O1}$. After the selection process, the longest Pb—I bond length at the interface was calculated (FIG. 8A). The Pb—I bond length may reflect the distortion of the $PbI_6$ octahedron and the immobilization of I. According to the calculation, the Pb—I bond without $V_{O2}$ interference was 3.452 Å but it was increased to 3.564 Å after the introduction of $V_{O2}$. Oxygen vacancies affect the Pb—I—Sn linkage by increasing positive charge near the Sn atoms and form a less stable chemical bond between Pb and I. The unstable Pb—I bond may increase the possibility of the distortion of the $PbI_6$ octahedron by deviating from the ideal bond angle of Pb—I—Pb, which may lead to undesirable perovskite phase transition.

This distortion changes the iodine-mediated corner-sharing $PbI_6$ octahedron to the edge-sharing $PbI_6$ octahedron and further distortion changes the edge-sharing $PbI_6$ octahedron to the face-haring $PbI_6$ octahedron. The face-haring $PbI_6$ octahedron demonstrates phase transition to δ-$FAPbI_3$. Furthermore, because I is loosely bonded to Pb, it is assumed that the increased Pb—I bond length promotes the generation of iodine interstitials ($I_i$). Based on this assumption, the energy of iodine Frenkel pair formation (generation of interstitial atoms at the vacancy sites) was compared with respect to the presence of oxygen vacancies (FIG. 8B). After the introduction of $V_{O2}$ to the system, the formation energy was decreased from 2.37 eV to 1.24 eV, making it more likely that iodine interstitials ($I_i$) would be generated. $I_i$ are known as initiators of δ-$FAPbI_3$ formation, which lowers the activation energy of the phase transition from α-$FAPbI_3$ to δ-$FAPbI_3$ and accelerates the decomposition process through propagation into the perovskite bulk.

Therefore, the $PbI_6$ octahedron is distorted and the undesirable phase transition of α-$FAPbI_3$ occurs as shown in FIG. 8C.

In general, excessive iodine interstitials ($I_i$) are supplied from an external system. However, the spontaneous generation of $I_i$ at the interface is a serious problem. That is to say, the oxygen vacancies of $SnO_{2-x}$ increase the Pb—I bond length at the interface and form $I_i$, resulting in unfavorable phase transition to δ-$FAPbI_3$.

Test Example 6: Analysis of Organic Cation Retention Capacity of Tin Oxide

Figure 9:
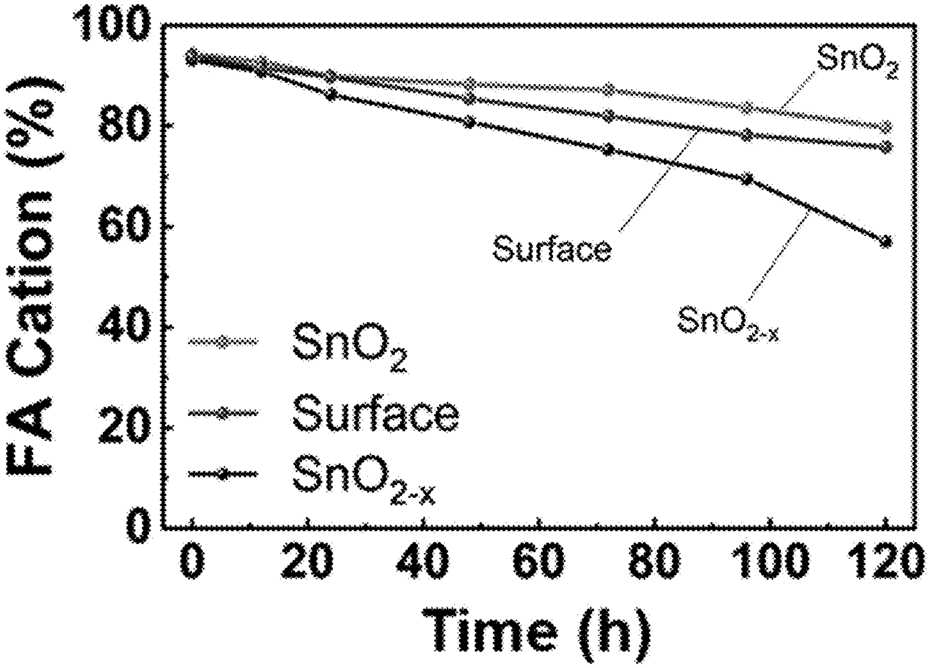
FIG. 9 shows the XPS analysis result of an exfoliated perovskite film in Test Example 6.

FA (formamidinium) cation is generally bonded to the $PbI_6$ cage through hydrogen bonding between the I atom and H atom of FA. For the $FAPbI_3/SnO_{2-x}$ interface, the 0 atoms of $SnO_{2-x}$ can provide hydrogen bonding sites in the absence of oxygen vacancies. To prove this, organic cation loss was traced at the $FAPbI_3/SnO_{2-x}$ (or $SnO_2$) interface by XPS. Precisely, the perovskite film $((FAPbI_3)_{0.95}(MAPbBr_3)_{0.05})$ deposited on $SnO_{2-x}$ or $SnO_2$ was annealed at 85° C. (relative humidity 15%). It was because, among the important factors of perovskite degradation, heat stress accelerates the loss of organic cations mainly through evaporation and decomposition. After the heat treatment, the perovskite film was peeled off from the substrate and the exfoliated surface was characterized by XPS. In addition, the surface of the perovskite exposed to air before the peeling was analyzed for comparison of the degree of cation loss. The result is shown in FIG. 9.

In the N 1s spectrum of the perovskite film, two main peaks assigned to FA cation (≈400 eV) and MA complex (≈402 eV, byproduct of organic decomposition of MA cation) were observed. For all the prepared samples, the area ratio of the two peaks was 95/5, which proves that the perovskite film was prepared with the intended stoichiometry. After 48 hours of the heat treatment, the surface of the perovskite peeled off from $SnO_{2-x}$ showed slight decrease of FA cations, which was significant compared to other two samples. When thermal annealing was performed further for 72 hours, the loss of FA cations was accelerated from 80.71 mol % to 57.03 mol %. In contrast, the surface of the perovskite peeled off from $SnO_2$ showed remarkable organic cation retention capacity. The molar ratio of the FA cations was decreased only by 6.07 mol % from 94.32 mol %. Surprisingly, the organic cation retention capacity of the perovskite film peeled off from $SnO_2$ was much higher than that of the perovskite exposed to air before the peeling process. The absence of hydrogen bonding sources for the FA cations and the deleterious interactions with oxygen and moisture may have induced further loss of the FA cations on the surface of the perovskite exposed to air. That is to say, the XPS spectrum analysis result proves that the oxygen atoms at the interface are important in retaining the FA cations in the perovskite lattice.

Test Example 7: Analysis of Performance and Operational Stability of Perovskite Solar Cell (PSC)

Figure 10A:
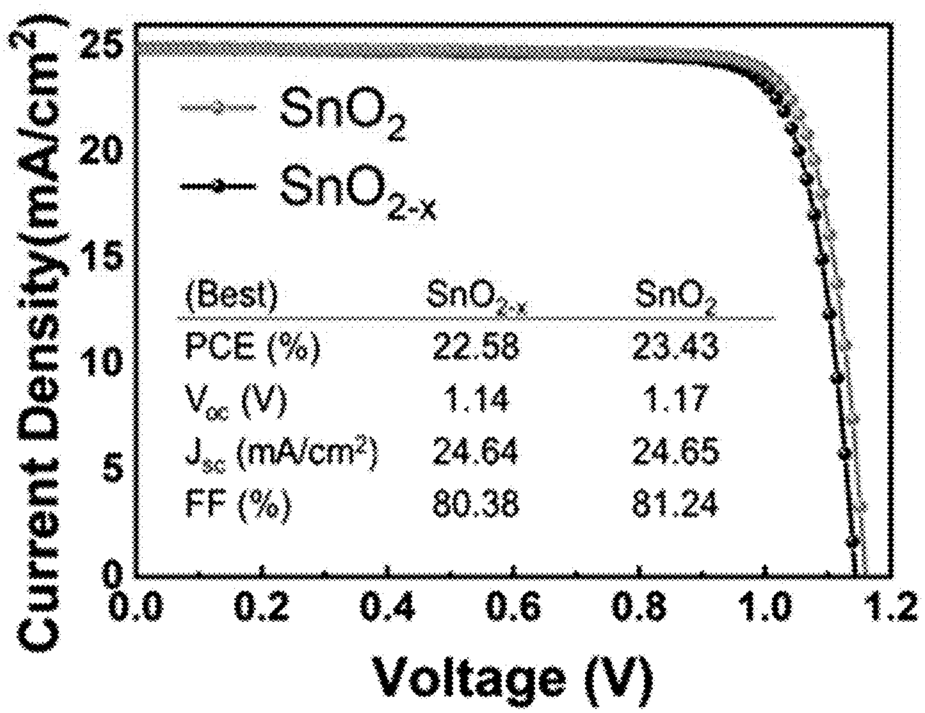
FIGS. 10A and 10B show results of analyzing the performance of a PSC in Test Example 7.
Figure 10B:
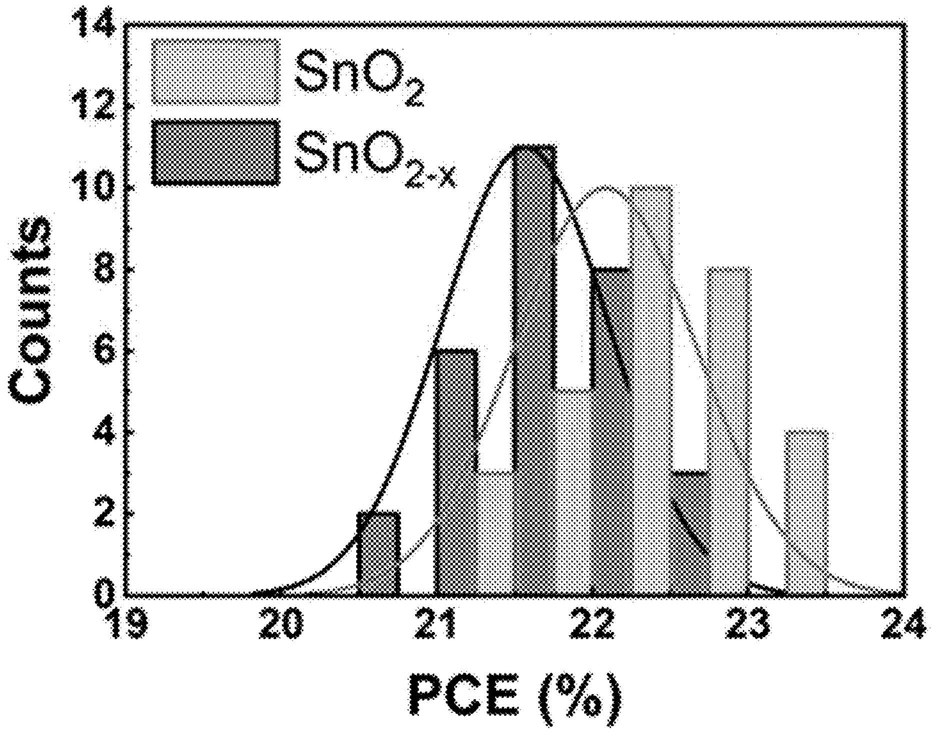

In this test example, the performance of PSCs having $SnO_{2-x}$ or $SnO_2$ layers was evaluated. The result is shown in FIGS. 10A and 10B. A $FAPbI_3$-based PSC was fabricated with the composition Au/spiro-OMeTAD/$Cs_{0.05}(FAPbI_3)_{0.95}(MAPbBr_3)_{0.05}$/$SnO_{2-x}$ or $SnO_2$/FTO.

FIG. 10A shows the J-V curves of the maximum PCE for each tin oxide layer. As the oxygen vacancies were decreased in $SnO_{2-x}$, i.e., in $SnO_2$, the PCE was improved from 22.58% to 23.43% due to significant improvement in $V_{oc}$ and FF. The integrated $J_{sc}$ values were close to the $J_{sc}$ value of the J-V curves (integrated $J_{sc}$: 24.59 mA/cm$^2$ ($SnO_{2-x}$) and 24.65 mA/cm$^2$ ($SnO_2$)). The average performance was improved with $V_{oc}$ from 1.13 V to 1.16 V, $J_{sc}$ from 24.37 mA/cm$^2$ to 24.46 mA/cm$^2$, FF from 79.48% to 80.11% and PCE from 21.89% to 22.73%. The improvement of $V_{oc}$ and FF was achieved by the decreased nonradiative recombination of oxygen vacancies and the suppression of 5-phase $FAPbI_3$. The decrease of oxygen vacancies resulted in the decrease of the shunt resistance ($R_{sh}$) of $SnO_2$ and the increase of FF. Favorable energy band alignment may be induced by suppressing δ-phase $FAPbI_3$ at the $FAPbI_3/SnO_2$ interface and $V_{oc}$ can be increased through this.

In addition, the hysteresis effect can be alleviated by the synergistic effect. To obtain reliable results, 30 devices were prepared for each condition. The statistical distribution of the PCEs is shown in FIG. 10B.

The same experiment was carried out for the chemical bath deposition-derived $SnO_{2-x}$ (CBD $SnO_{2-x}$) prepared in Example 1 and other $SnO_{2-x}$ such as Alfa Aesar $SnO_{2-x}$ nanoparticles ($SnO_{2-x}$ NPs) and $SnO_{2-x}$ QDs. CBD $SnO_{2-x}$ and $SnO_{2-x}$ NPs require an aqueous precursor solution that can change the chemical state of O-BPs because the 0-BPs generally interact easily with $H_2O$. The modified O-BPs may not act as an appropriate passivator for $SnO_{2-x}$. Based on this concern, O-BPs were applied first to the precursor for CBD $SnO_{2-x}$ and $SnO_{2-x}$ NPs for bulk passivation. When the bulk passivation was applied, the PCE of the two $SnO_{2-x}$-based PSCs was decreased. The FF was decreased significantly in both systems, indicating that the O-BPs acted as an insulator that increases the shunt resistance of the $SnO_{2-x}$ layer rather than as a passivator. The more severe decrease of FF in CBD $SnO_{2-x}$ suggests that the O-BPs had an additional negative effect on the growth of $SnO_{2-x}$, which may be due to hydrochloric acid and the long process time of CBD.

Then, O-BPs were used as a surface passivator by post-processing with an O-BP dispersion. The post-treated $SnO_{2-x}$ may exhibit a passivation effect without exposing the O-BPs to an aqueous medium. Unlike the bulk passivation, the surface passivation increased $V_{oc}$ and FF without change in the chemical state of the O-BPs, thereby improving the PCE of the PSC. This indicates that the O-BPs can properly passivate various $SnO_{2-x}$. In addition, the improvement of photovoltaic parameters was similar for the surface passivation to the bulk passivation of $SnO_{2-x}$ in a nonaqueous medium.

For further verification, $SnO_{2-x}$ QDs were synthesized through hydrolysis and dispersed in IPA, which were subjected to bulk passivation by adding O-BPs to the $SnO_{2-x}$ QD dispersion. After the bulk passivation, the average PCE of the PSC was increased from 19.25% to 20.18%. This result clearly shows that O-BPs can passivate various kinds of $SnO_{2-x}$ in the same manner.

Figure 11:
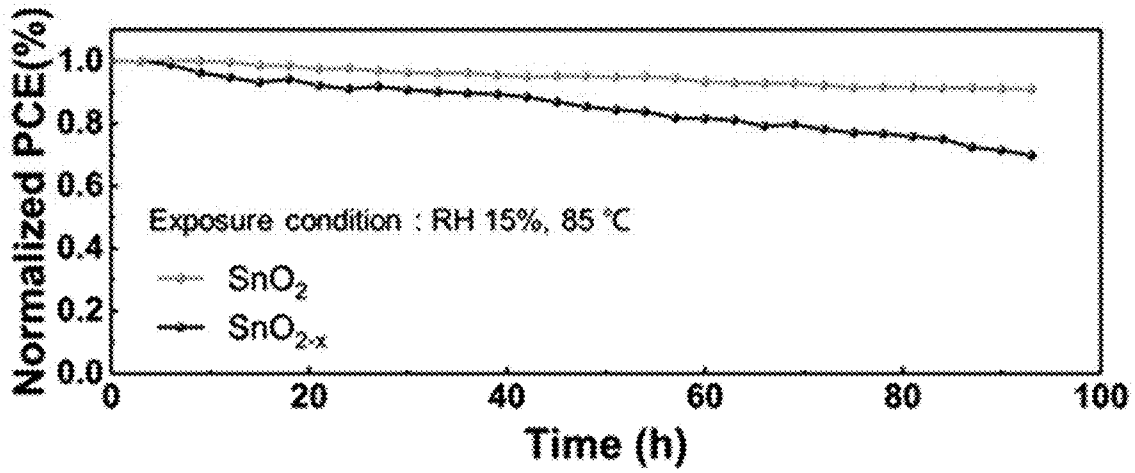
FIG. 11 shows a result of evaluating the thermal stability of a PSC in Test Example 7.

Since the withdrawal of FA cations from the perovskite lattice is one of the causes of unfavorable phase transition, the thermal stability of the PSC was evaluated. The result is shown in FIG. 11. Heat can provide sufficient energy for the transport and volatilization of FA ions. The PCE of the PSC was tracked every 3 hours using J-V scan while exposing the PSC to 85° C. After 4 days of heating, the $SnO_{2-x}$-based PSC of Example 1 maintained 70% of initial PCE, whereas the $SnO_2$-based PSC of Comparative Example 1 maintained 90% of initial PCE.

Figure 12:
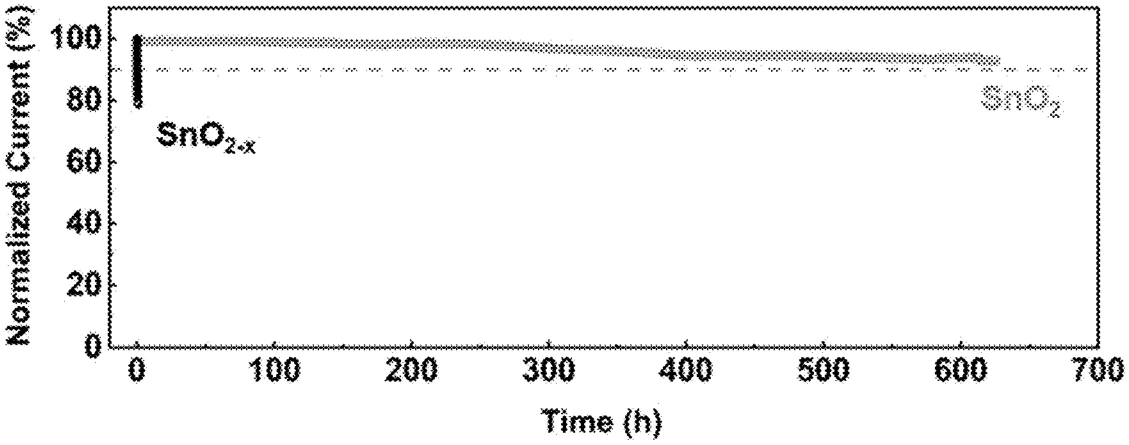
FIG. 12 shows a result of evaluating the operational stability of a PSC in Test Example 7.

Finally, operational stability was measured to confirm the stable power output of the cell that exhibited the best performance. The result is shown in FIG. 12. The photocurrent of the cell was monitored for nearly 70 hours in the ambient atmosphere with 0.9 V voltage biasing and light illumination (xenon lamp, 100 mW/$cm^2$, no UV-blocking filter). The cell was encapsulated using a cover glass and epoxy before the measurement of long-term stability. Whereas the $SnO_{2-x}$-based PSC of Comparative Example 1 lost 20% of initial photocurrent within 1 hour after light irradiation, the $SnO_2$-based PSC of Example 1 maintained 90% or more of initial photocurrent for nearly 625 hours.

Figure 13:
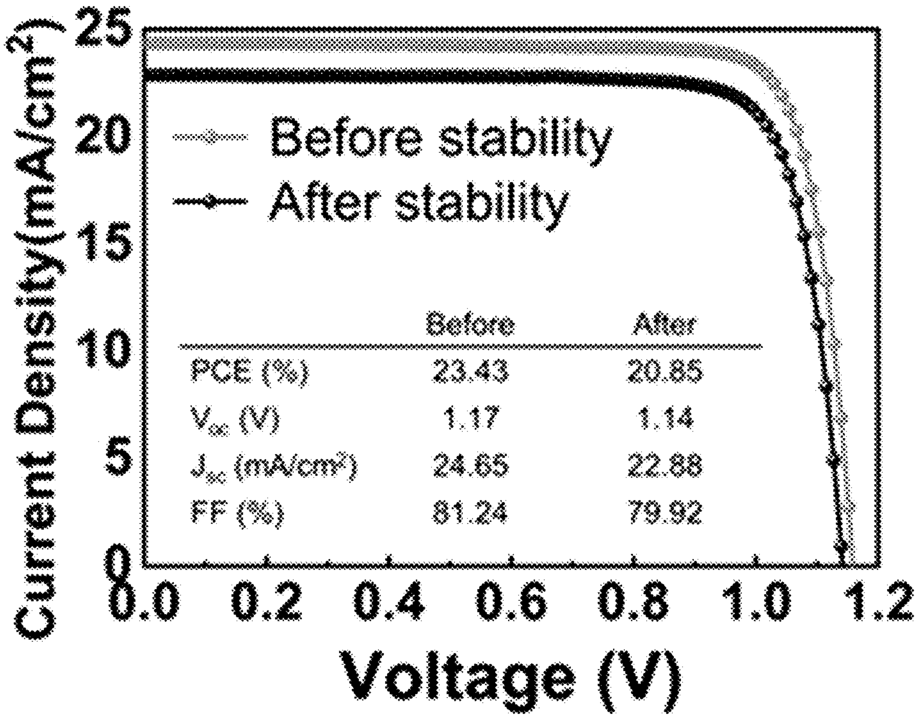
FIG. 13 shows J-V curves obtained measuring the long-term stability of PSCs in Test Example 7.

The J-V curve was obtained immediately after the long-term stability measurement for more accurate measurement of PCE deterioration. The result is shown in FIG. 13. The PCE decreased from 23.43% to 20.85%, with 11% of loss from initial PCE. A stable power output was exhibited under constant light irradiation.

While the exemplary embodiment of the present disclosure have been described, those having ordinary knowledge in the art will be able to change and modify the present disclosure variously through addition, change, deletion, etc. of elements without departing from the scope of the present disclosure defined in the appended claims.

What is claimed is:

1. An electron transport layer for a halide perovskite solar cell, which is tin oxide ($SnO_{2-x}$, $0<x<1$) comprising oxygen vacancies, wherein the oxygen vacancies are passivated by oxidized black phosphorus quantum dots (O-BPs).

2. The electron transport layer for a halide perovskite solar cell according to claim 1, wherein the oxidized black phosphorus quantum dots exhibit peaks at 129-130.5 eV and 132.5-133.5 eV in X-ray photoelectron spectroscopy (XPS) analysis.

3. The electron transport layer for a halide perovskite solar cell according to claim 1, wherein the oxidized black phosphorus quantum dots have a diameter of 4.5-5.5 nm.

4. A perovskite solar cell comprising the electron transport layer for a halide perovskite solar cell according to claim 1.

5. The perovskite solar cell according to claim 4, wherein the perovskite solar cell comprises:

a front electrode;

an electron transport layer formed on the front electrode, which comprises tin oxide ($SnO_{2-x}$, $0<x<1$) comprising oxygen vacancies, wherein the oxygen vacancies are passivated by oxidized black phosphorus quantum dots (O-BPs);

a halide perovskite photoactive layer formed on the electron transport layer;

a hole transport layer formed on the halide perovskite photoactive layer; and a back electrode formed on the hole transport layer.

6. The perovskite solar cell according to claim 4, wherein the halide perovskite of the halide perovskite photoactive layer is represented by Chemical Formula 1:

$$AMX_3 \quad \text{[Chemical Formula 1]}$$

wherein

A is $CH(NH_2)_2^+$, $CH_3NH_3^+$ or $NR_4^+$, wherein each R is independently a hydrogen atom or a $C_1$-$C_{10}$ alkyl group, M is Pb, Sn, Bi, Ge, Ga, Ti, In, Sb or Mn, and X is I.

7. The perovskite solar cell according to claim 6, wherein the halide perovskite represented by Chemical Formula 1 is $FAPbI_3$ (formamidinium (FA) lead triiodide).

8. The perovskite solar cell according to claim 5, wherein the electron transport layer exhibits a shoulder peak between 2.0 and 2.5 Å in K-edge XAFS (X-ray absorption fine structure) analysis.

9. The perovskite solar cell according to claim 5, wherein, in the electron transport layer, the oxidized black phosphorus quantum dots (O-BPs) are located throughout the electron transport layer or at the interface of the electron transport layer and the halide perovskite photoactive layer.

10. The perovskite solar cell according to claim 5, wherein the front electrode comprises any one selected from ITO (indium tin oxide), FTO (fluorine-doped tin oxide), GZO (gallium zinc oxide), IZO (indium zinc oxide), IGZO (indium gallium zinc oxide), graphene, molybdenum disulfide ($MoS_2$), single-walled carbon nanotube (SWCNT), multi-walled carbon nanotube (MWCNT) and metal mesh.

11. The perovskite solar cell according to claim 5, wherein the hole transport layer comprises any one selected from spiro-OMeTAD (2,2',7,7'-tetrakis-(N,N-di-4-methoxyphenylamino)-9,9'-spirobifluorene), PEDOT:PSS (poly(3,4-ethylenedioxythiophene) polystyrene sulfonate), P3HT (poly (3-hexylthiophene-2,5-diyl)), PTAA (poly(t-arylamine)), PCBTDPP (poly[N-90-heptadecanyl-2,7carbazole-alt-3,6-bis(thiophen-5-yl)-2,5-dioctyl-2,5-dihydropyrrolo[3,4]pyrrole-1,4-dione]), PDPPDBTE (poly[2,5-bis(2-decyldodecyl)pyrrolo[3,4-c]pyrrole-1,4(2H,5H)-dione-(E)-1,2-di(2,2'-bithiophen-5-yl)ethene]), PCPDTBT (poly[2,1,3-benzothiadiazole-4,7-diyl[4,4-bis(2-ethylhexyl)-4Hcyclopenta[2,1-b:3,4-b']dithiophene-2,6-diyl]]), PCDTBT (poly[N-9'-heptadecanyl-2,7-carbazole-alt-5,5-(4",7"-di-2-thienyl-2",1",3"-benzothiadiazole)]), PFB (poly(9,9'-dioctylfluorene-co-bis-N,N'-(4-butylphenyl)-bis-N,N'-phenyl-1,4-phenylenediamine)), PANI (polyaniline), chloroaluminum phthalocyanine, tetracene, α-octithiophene, pentacene, lead(II) phthalocyanine, zinc phthalocyanine, copper(II) phthalocyanine, phthalocyanine blue, α-quaterthiophene, and α-quinguethiophene.

12. The perovskite solar cell according to claim 5, wherein the back electrode comprises any one selected from gold (Au), silver (Ag), aluminum (Al), graphene, carbon, graphite, single-walled carbon nanotube (SWCNT) and multi-walled carbon nanotube (MWCNT).

13. A method for preparing a perovskite solar cell, comprising:

(a) a step of preparing oxidized black phosphorus quantum dots (O-BPs);

(b) a step of preparing a tin oxide precursor solution or a tin oxide solution and a solution comprising the oxidized black phosphorus quantum dots (O-BPs);

(c) a step of coating the tin oxide precursor solution and the solution comprising the oxidized black phosphorus quantum dots on a front electrode substrate and preparing an electron transport layer comprising tin oxide wherein oxygen vacancies are passivated through heat treatment; and (d) a step of forming a halide perovskite photoactive layer on the electron transport layer.

14. The method for preparing a perovskite solar cell according to claim 13, wherein, the step (a) comprises:

a step of preparing black phosphorus quantum dots (BPQDs) by sonicating black phosphorus powder in an organic solvent; and a step of oxidizing the black phosphorus quantum dots (BPQDs).

15. The method for preparing a perovskite solar cell according to claim 13, wherein the sonication is performed sequentially by first sonication at 80-120 W for 8-12 hours and second sonication at 700-900 W for 1-3 hours.

16. The method for preparing a perovskite solar cell according to claim 13, wherein the oxidation is performed by subjecting the organic solvent comprising the black phosphorus quantum dots (BPQDs) to relative humidity 5-15% for 20-50 minutes.

17. The method for preparing a perovskite solar cell according to claim 13, wherein the organic solvent is one or more selected from isopropyl alcohol (IPA), acetone, dimethylacetamide (DMA), acetonitrile, tetrahydrofuran (THF), dimethyl sulfoxide (DMSO), dimethylformamide (DMF) and hexamethylphosphoramide.

18. The method for preparing a perovskite solar cell according to claim 13, wherein, in the step (b), the tin oxide precursor comprised in the tin oxide precursor solution is $SnCl_2$.

19. The method for preparing a perovskite solar cell according to claim 13, wherein, in the step (b), the tin oxide comprised in the tin oxide solution is $SnO_{2-x}$ nanoparticles or $SnO_{2-x}$ quantum dots.

20. The method for preparing a perovskite solar cell according to claim 13, wherein, in the step (c), the tin oxide precursor solution or the tin oxide solution is mixed with the solution comprising the oxidized black phosphorus quantum dots (O-BPs) and coated on the front electrode substrate for passivating the bulk, or the tin oxide precursor solution and the solution comprising the oxidized black phosphorus quantum dots (O-BPs) are coated sequentially on the front electrode substrate for passivating the interface of the electron transport layer and the perovskite photoactive layer.

* * * * *